(12) United States Patent
Fujita et al.

(10) Patent No.: US 6,784,880 B2
(45) Date of Patent: Aug. 31, 2004

(54) ELECTRO-OPTICAL DEVICE, CLOCK SIGNAL ADJUSTING METHOD AND CIRCUIT THEREFOR, PRODUCING METHOD THEREFOR, AND ELECTRONIC EQUIPMENT

(75) Inventors: Shin Fujita, Suwa (JP); Tokuro Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 468 days.

(21) Appl. No.: 09/731,668

(22) Filed: Dec. 8, 2000

(65) Prior Publication Data

US 2001/0003418 A1 Jun. 14, 2001

(30) Foreign Application Priority Data

Dec. 9, 1999 (JP) .......................................... 11-350559

(51) Int. Cl.[7] .................................................. G09G 5/00
(52) U.S. Cl. ..................................... 345/213; 345/204
(58) Field of Search ............................... 245/204–206, 245/211–213, 55–102; G09G 3/36

(56) References Cited

U.S. PATENT DOCUMENTS 5,646,642 A * 7/1997 Maekawa et al. ............. 345/99
5,854,615 A * 12/1998 Hush ........................... 345/99
6,067,061 A * 5/2000 Friedman .................... 345/74.1

FOREIGN PATENT DOCUMENTS

JP 04-350707 * 12/1992 ............. G09F/1/04

* cited by examiner

Primary Examiner—Alexander Eisen
(74) Attorney, Agent, or Firm—Oliff & Berridge, PLC

(57) ABSTRACT

The invention prevents shift register circuits from malfunctioning. A distribution circuit outputs a trailing trigger pulse DTP and a leading trigger pulse UTP. A trailing edge control circuit and a leading edge control circuit delay the trailing trigger pulse DTP and the leading trigger pulse UTP, respectively. The delay time of each of these control circuits can be set. These delay times are determined according to a threshold voltage of a TFT constituting a shift register. An inverted clock signal CLYINV is generated according to output signals of the control circuits. The shift register is driven by a clock signal CLY and an inverted clock signal CLYINV.

29 Claims, 18 Drawing Sheets

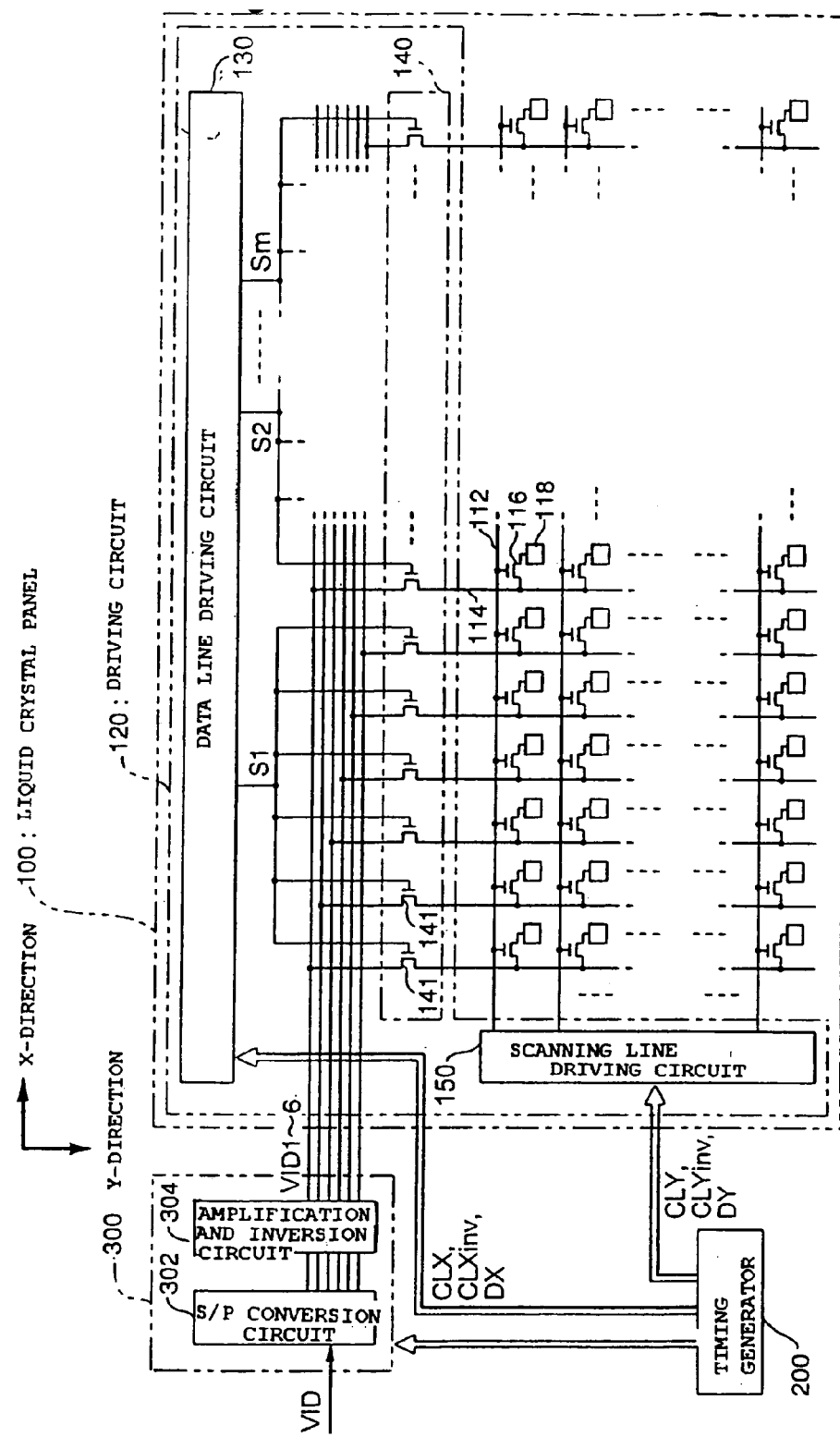
[FIG. 1]

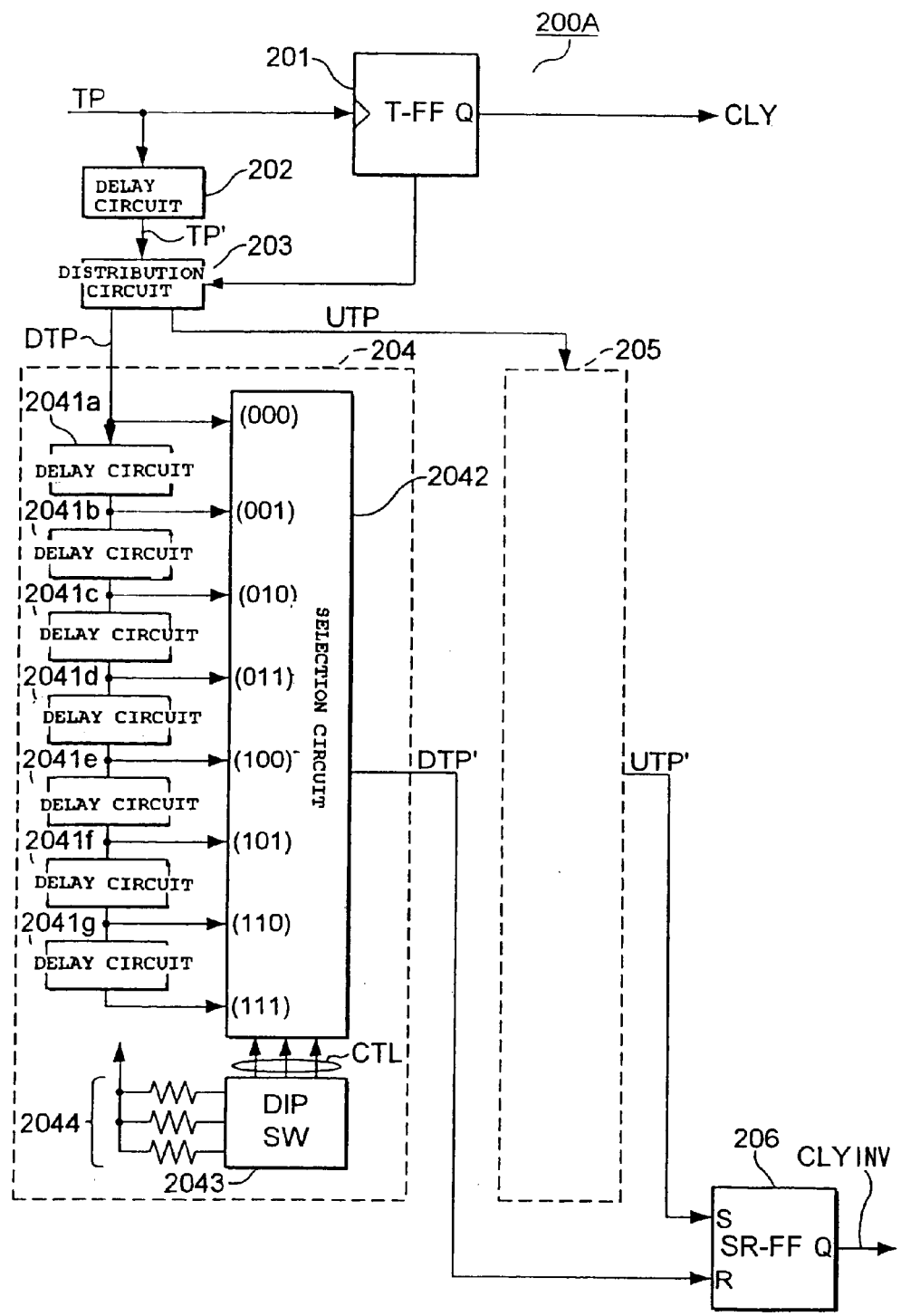
[FIG. 2]

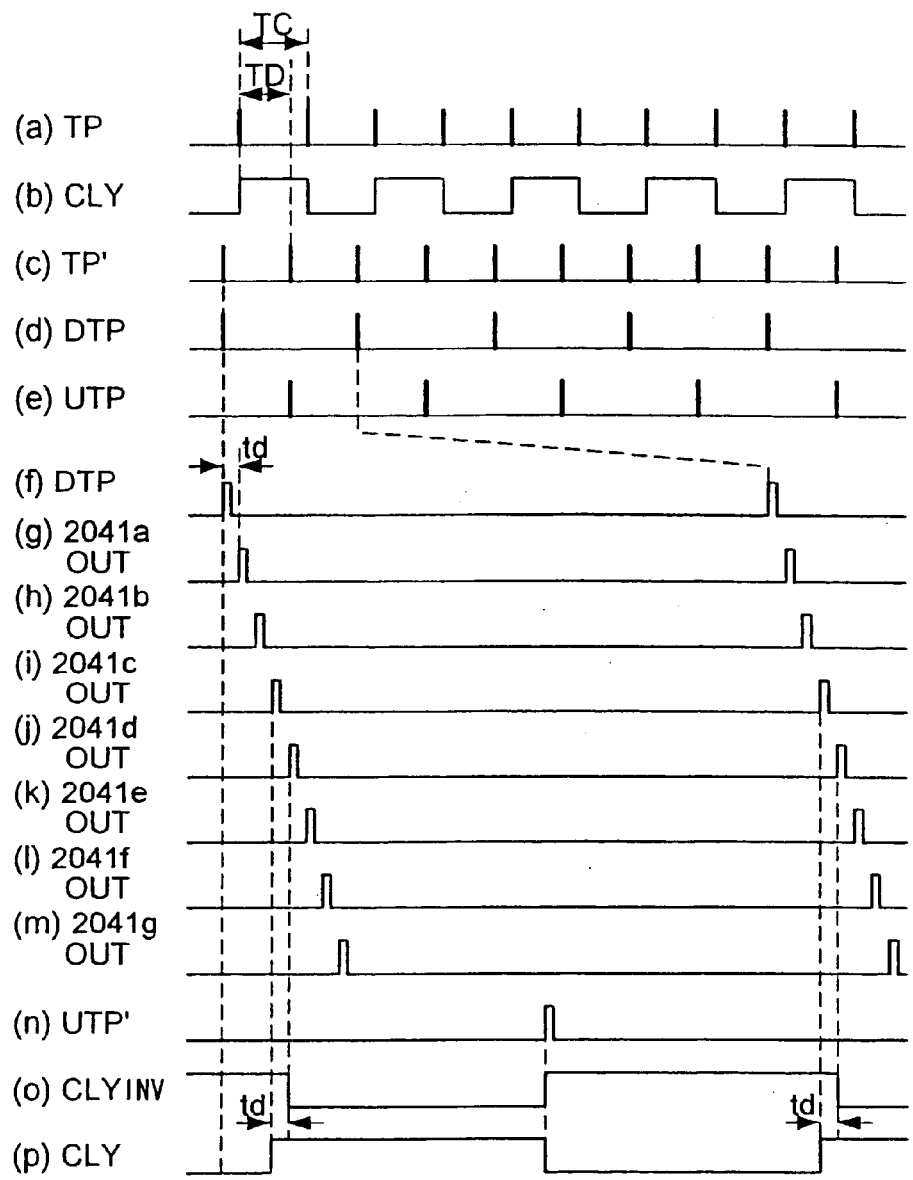

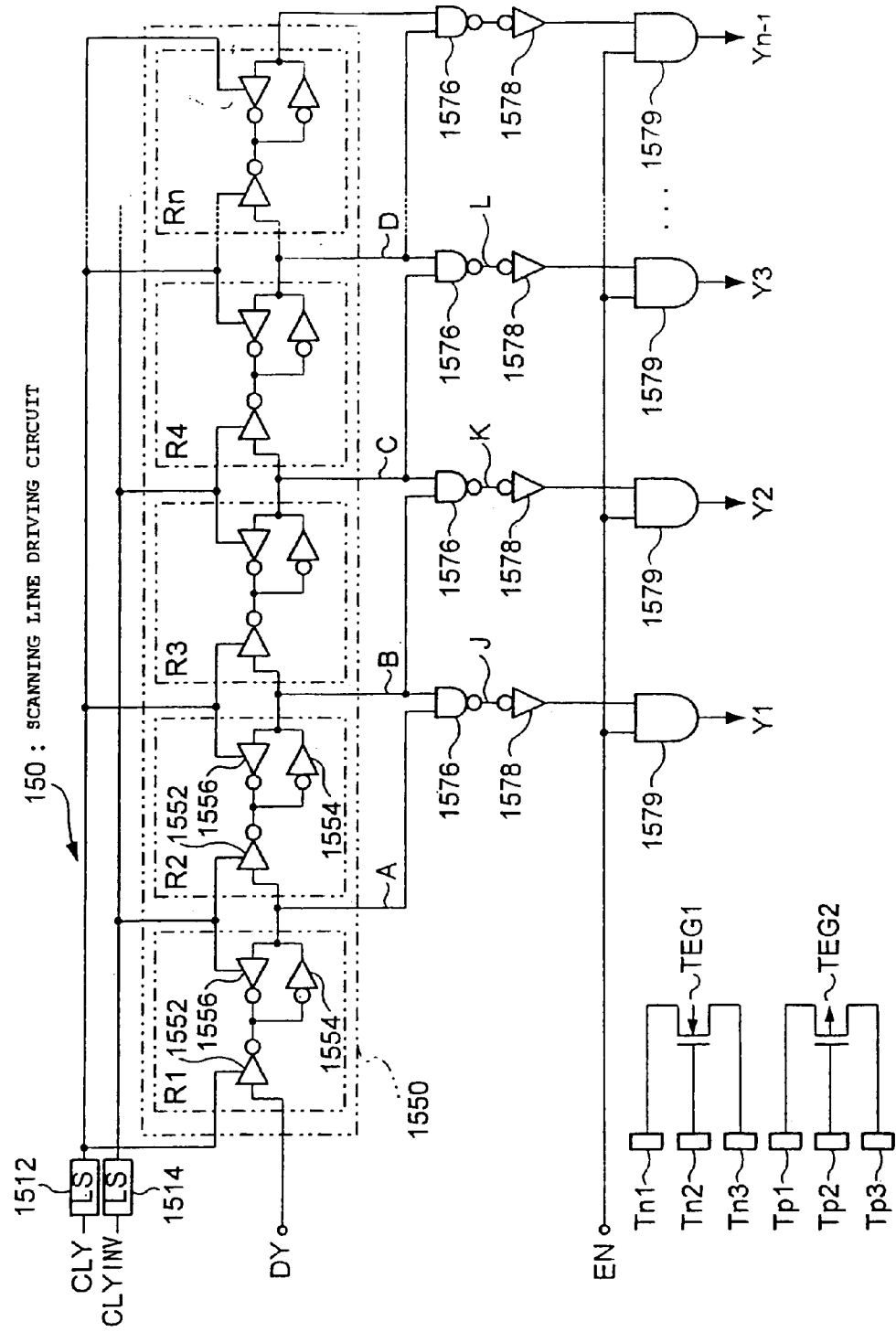
[FIG. 4]

[FIG. 5]
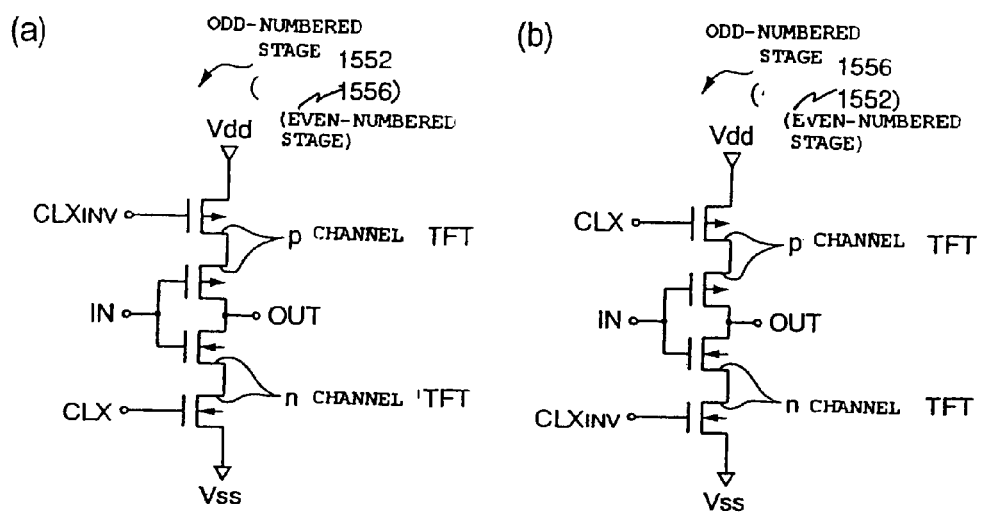
[FIG. 6]
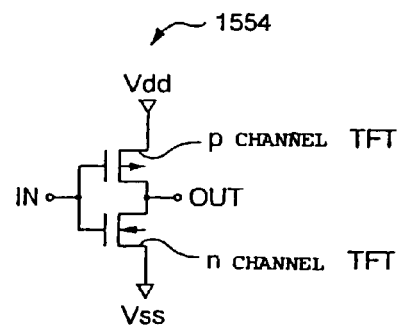

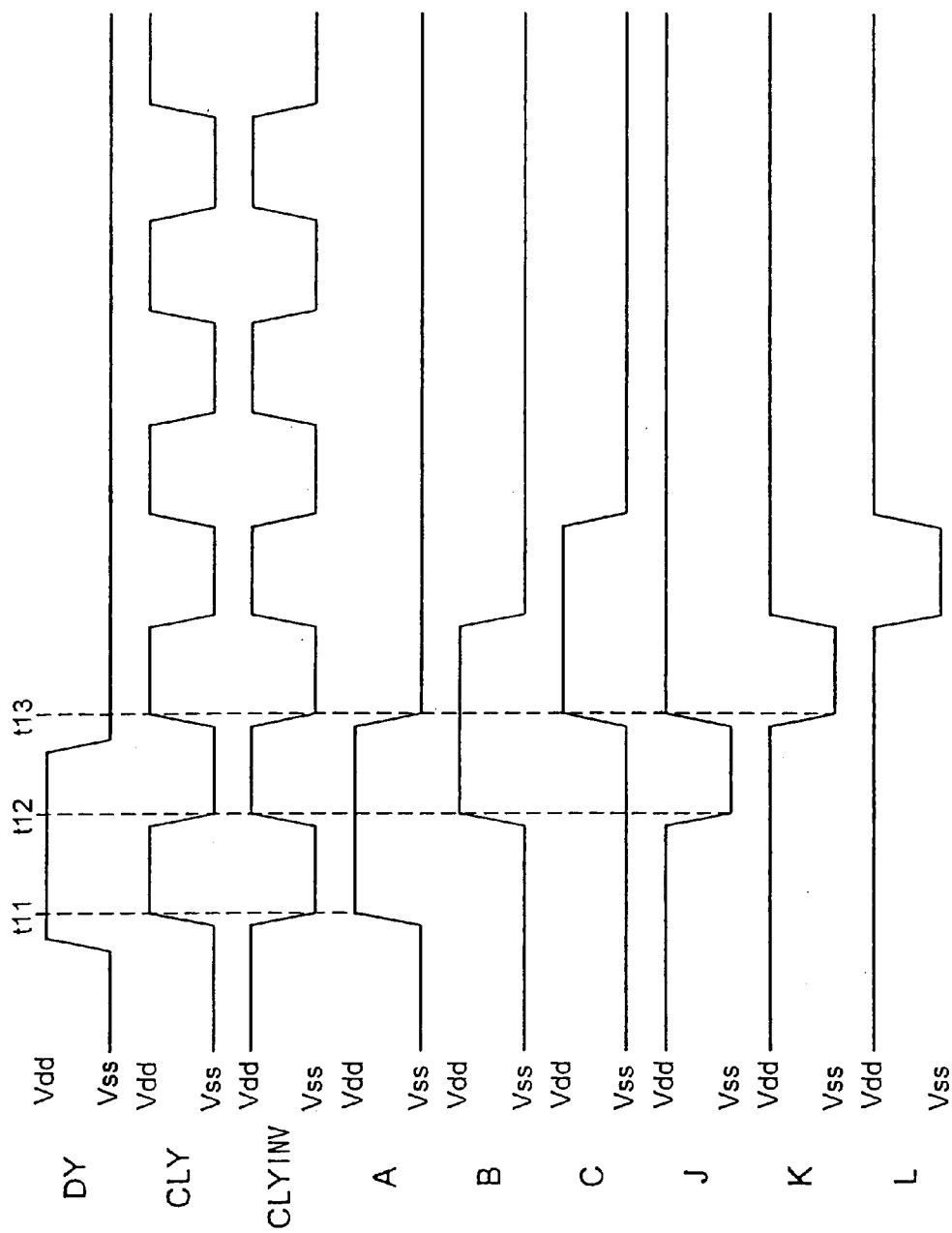

[FIG. 8]
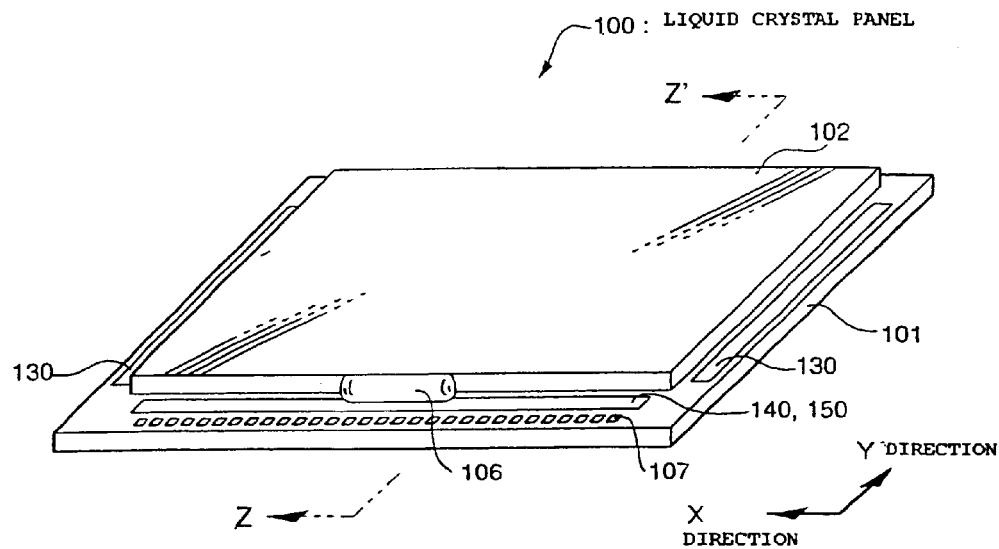
[FIG. 9]
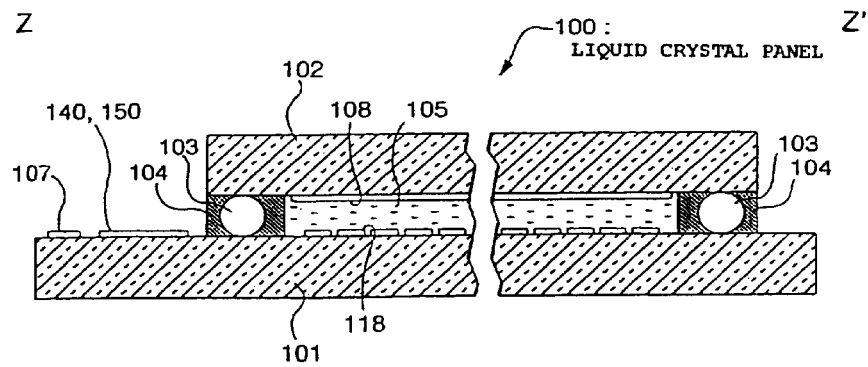

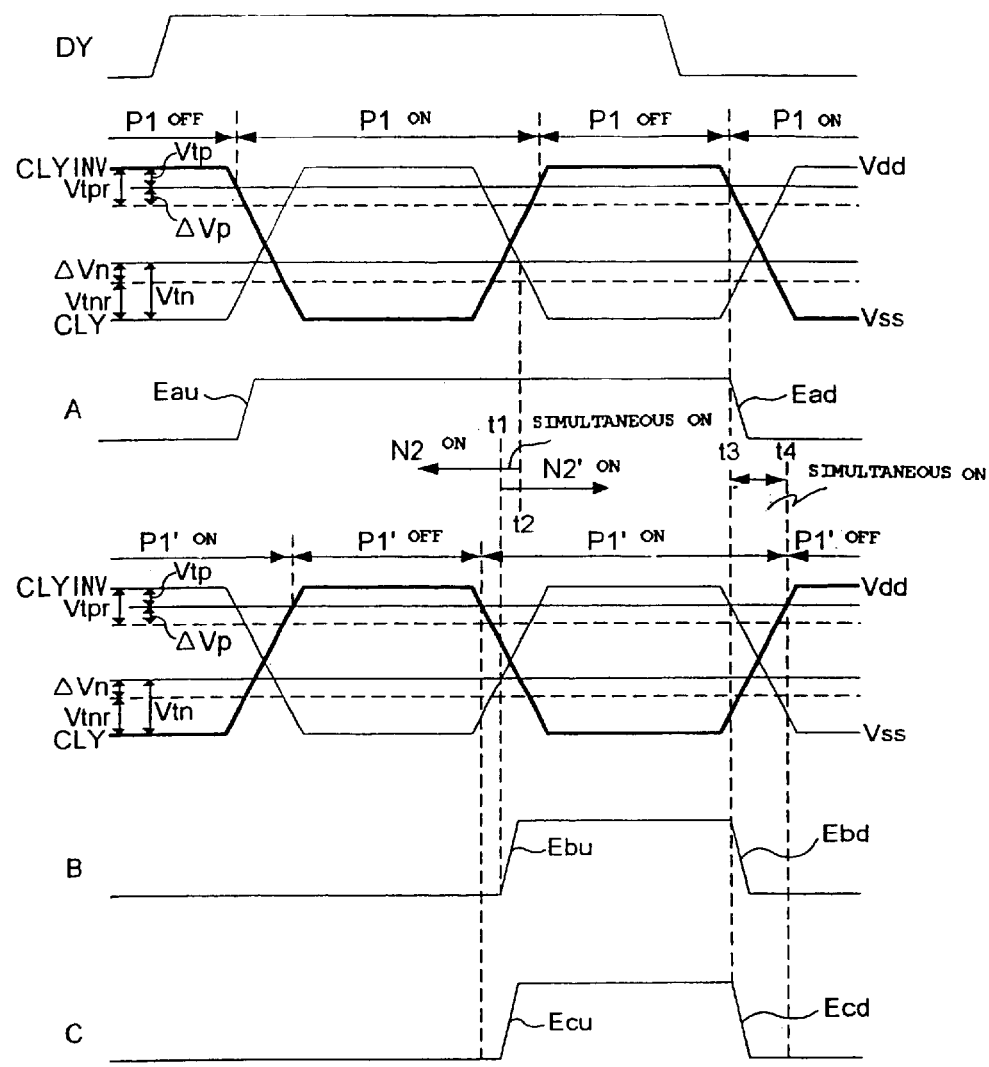
[FIG. 10]

[FIG. 11]
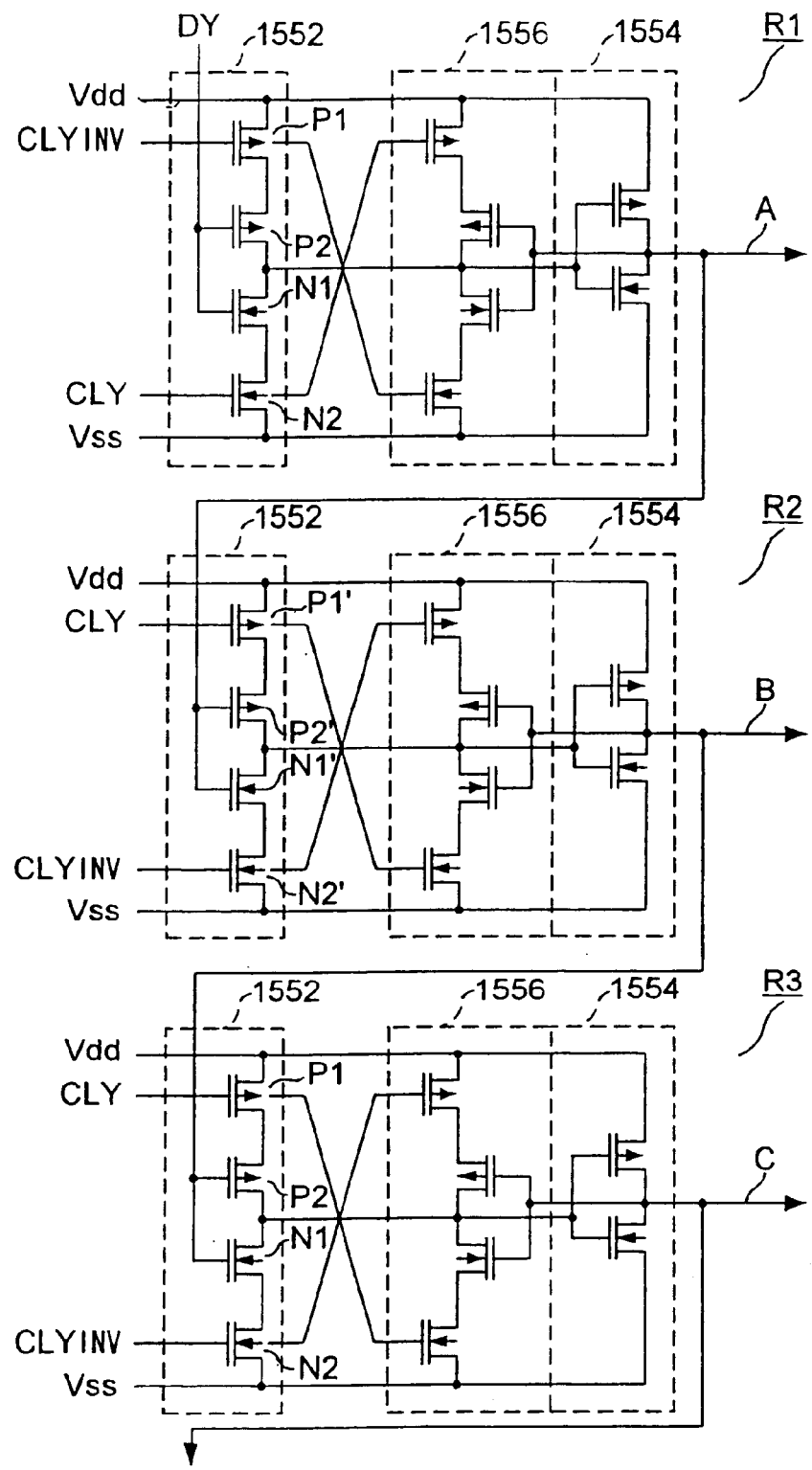

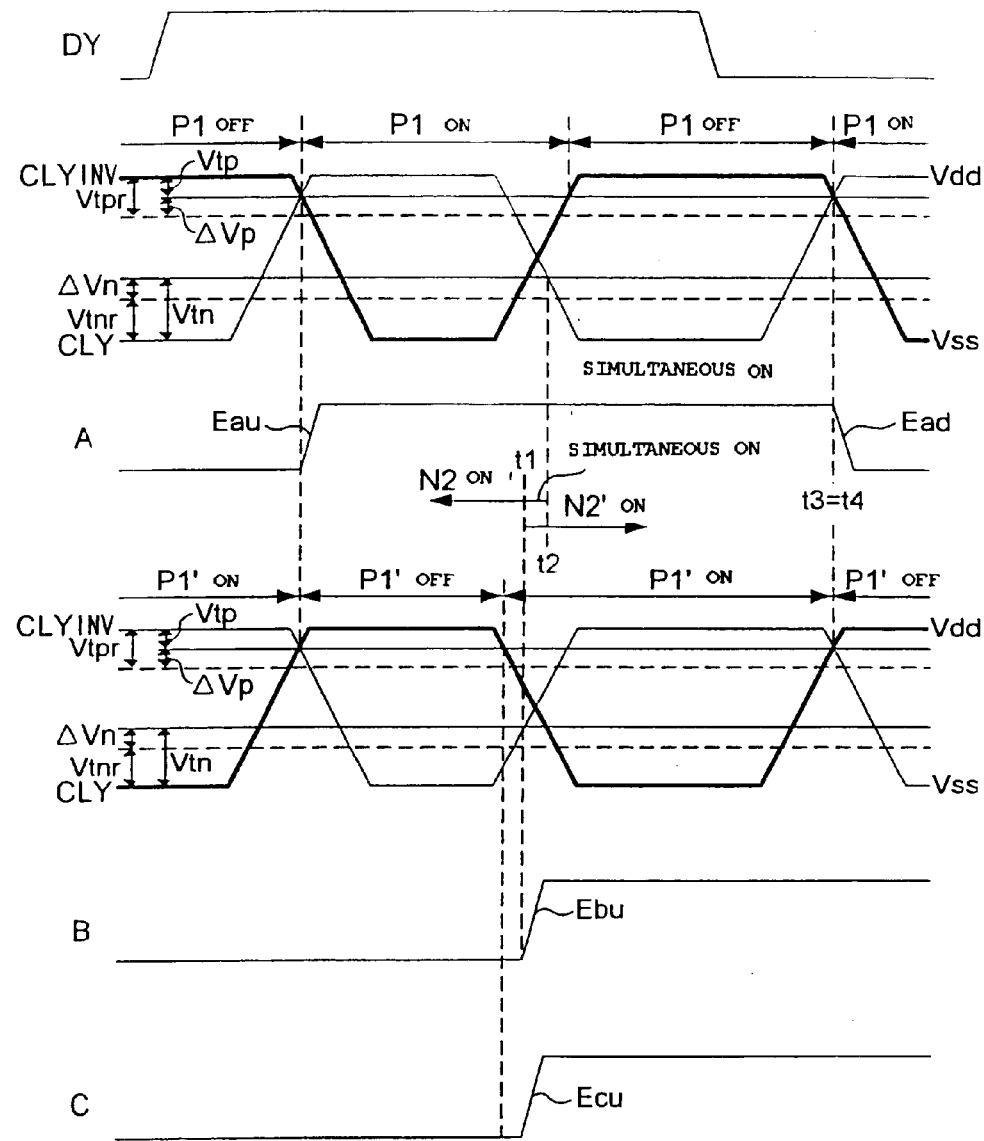
[FIG. 12]

[FIG. 13]
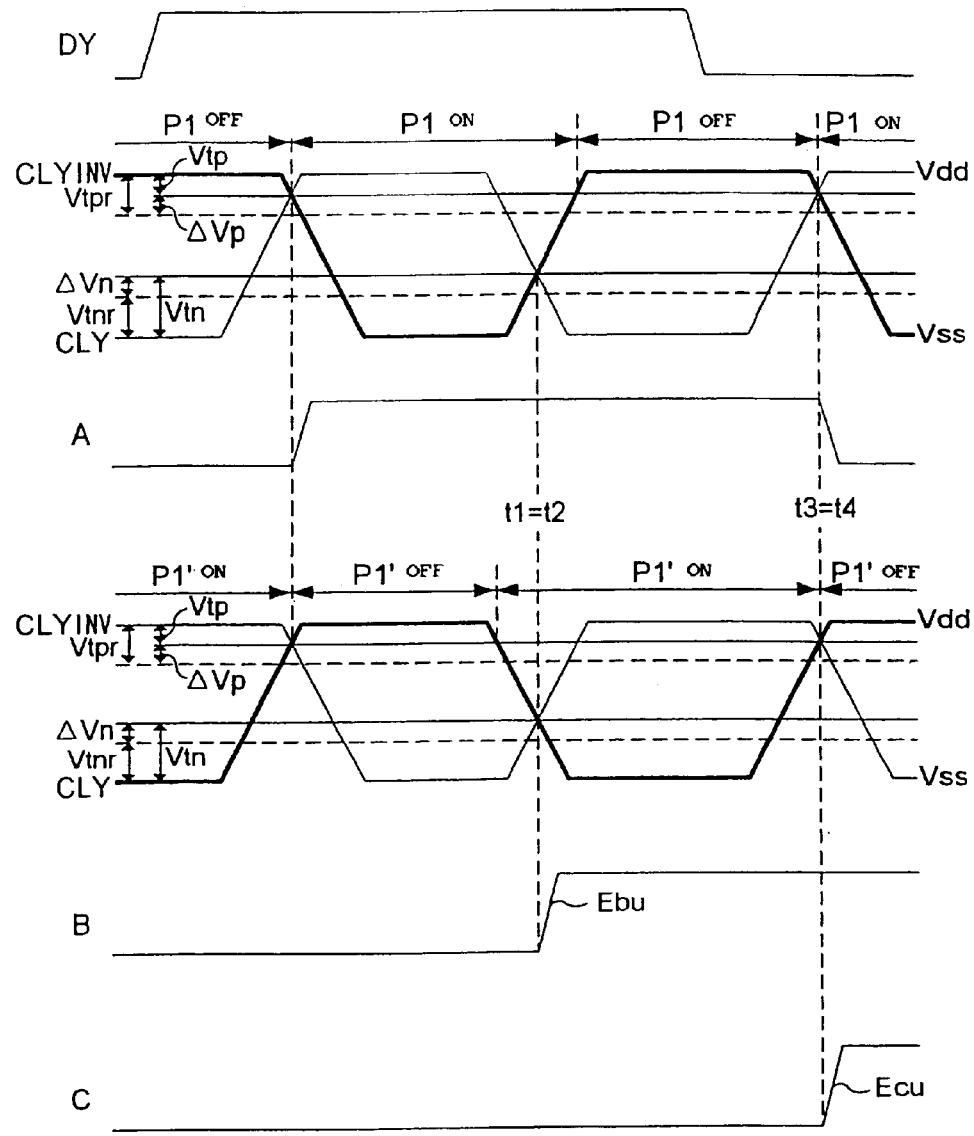

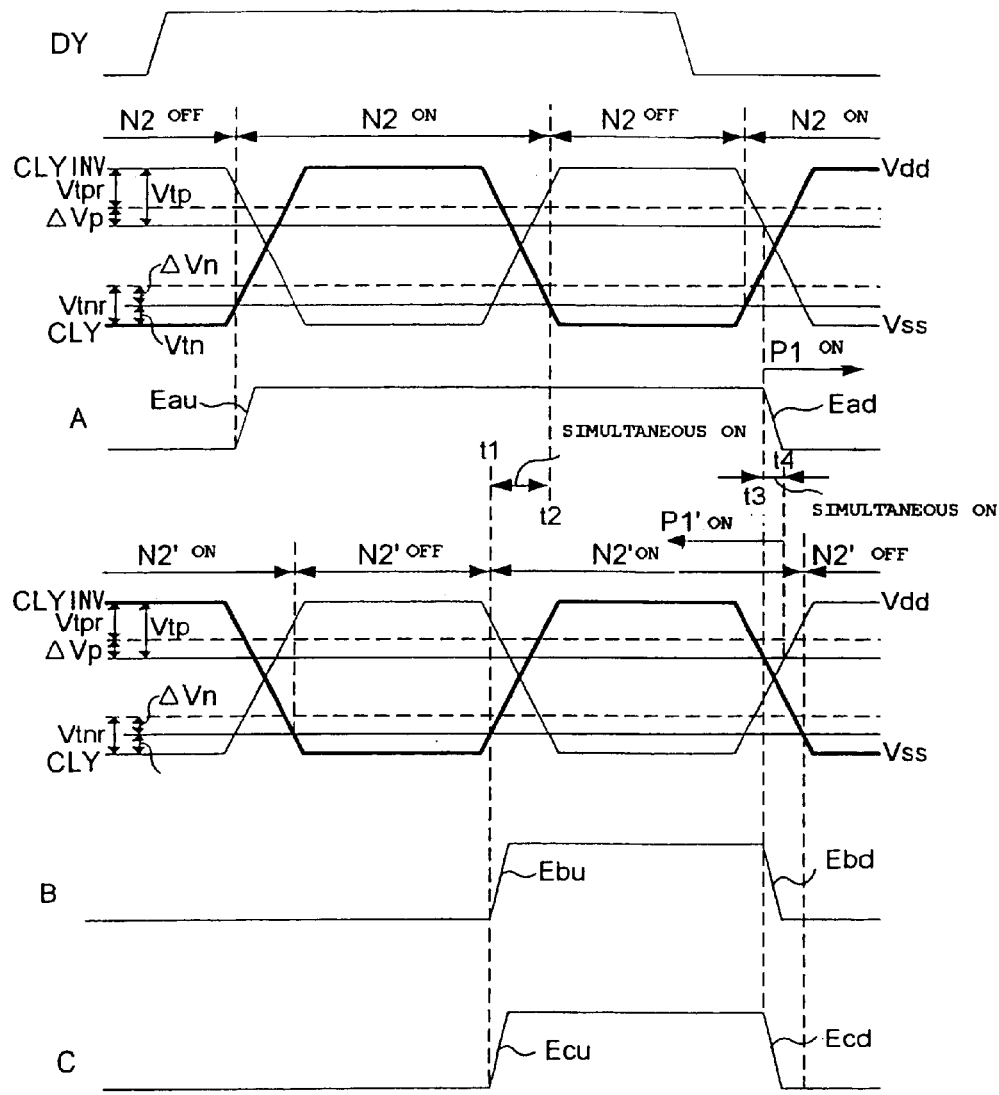
[FIG. 14]

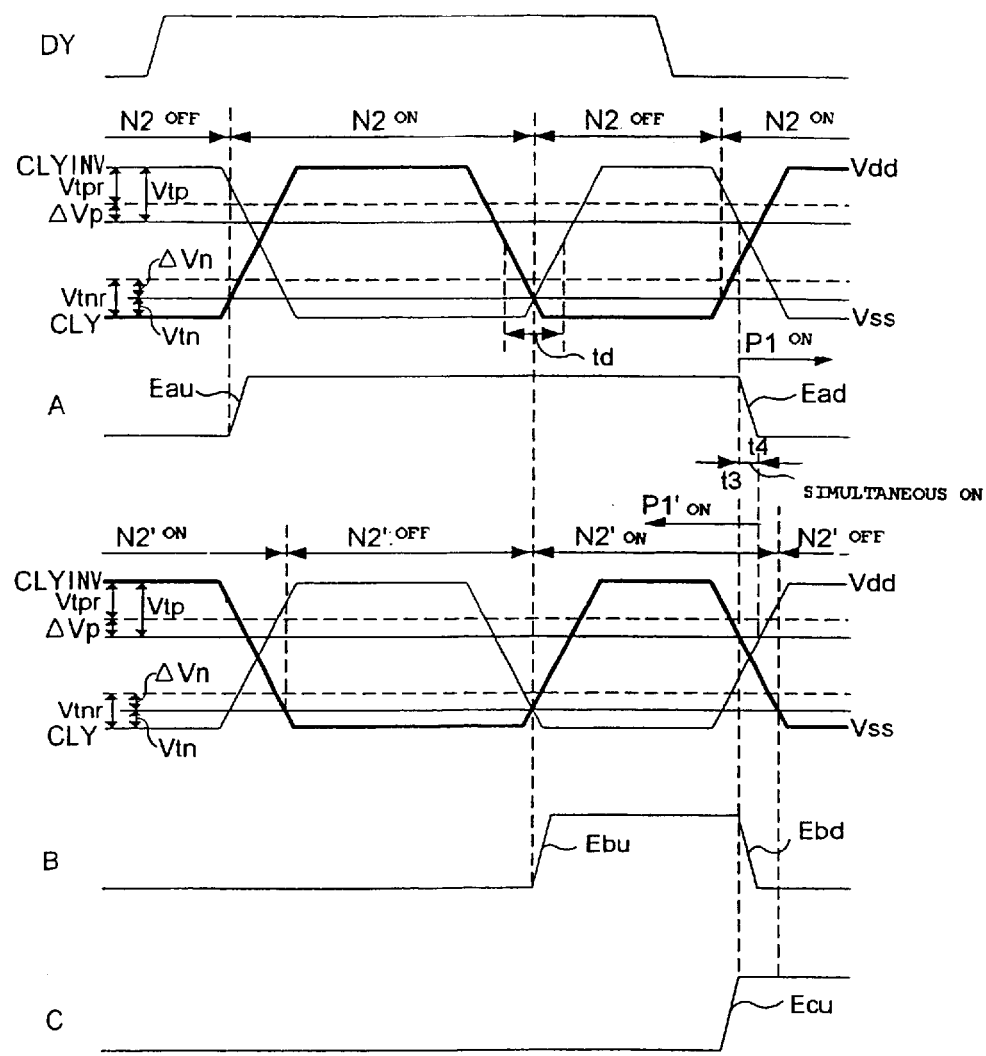
[FIG. 15]

[FIG. 16]
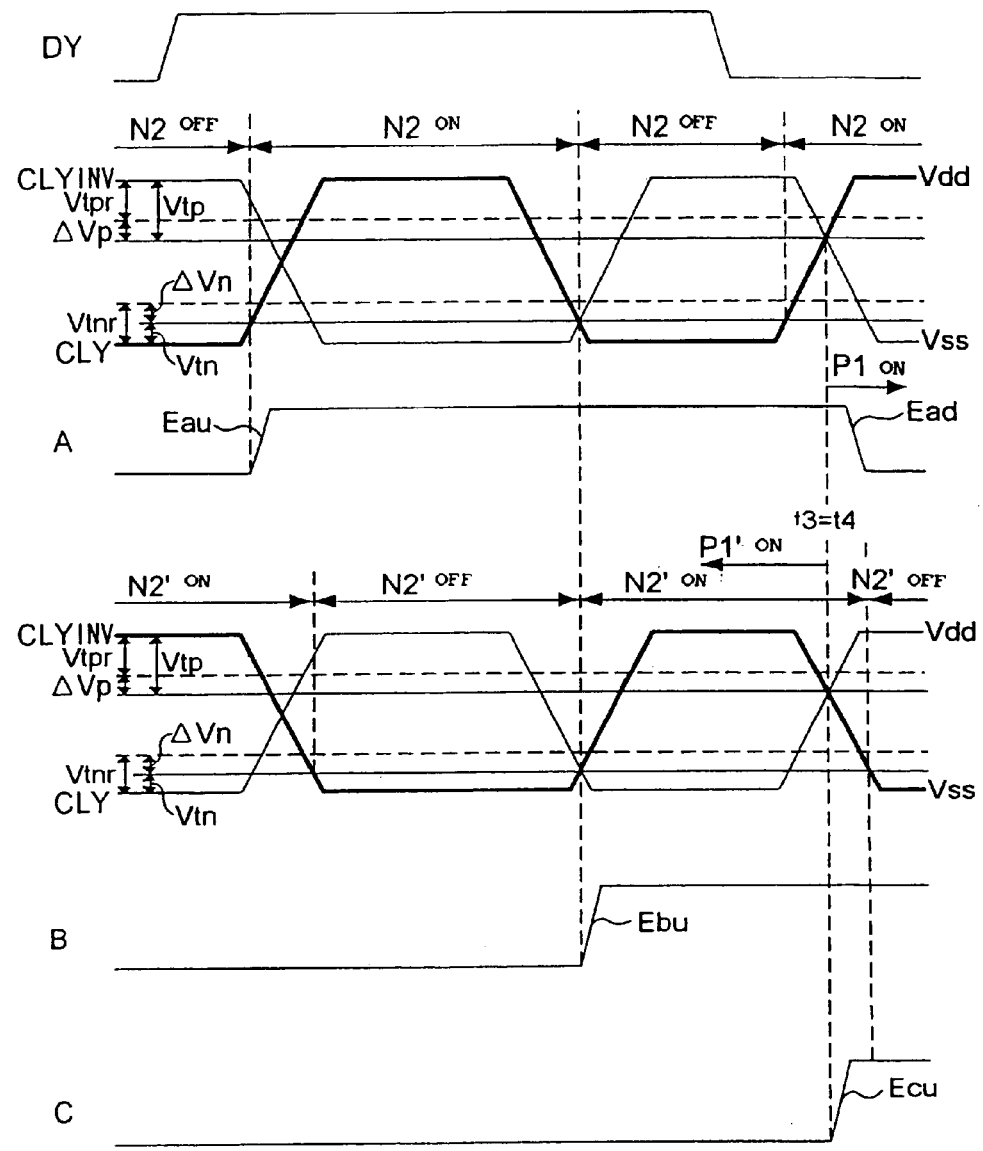

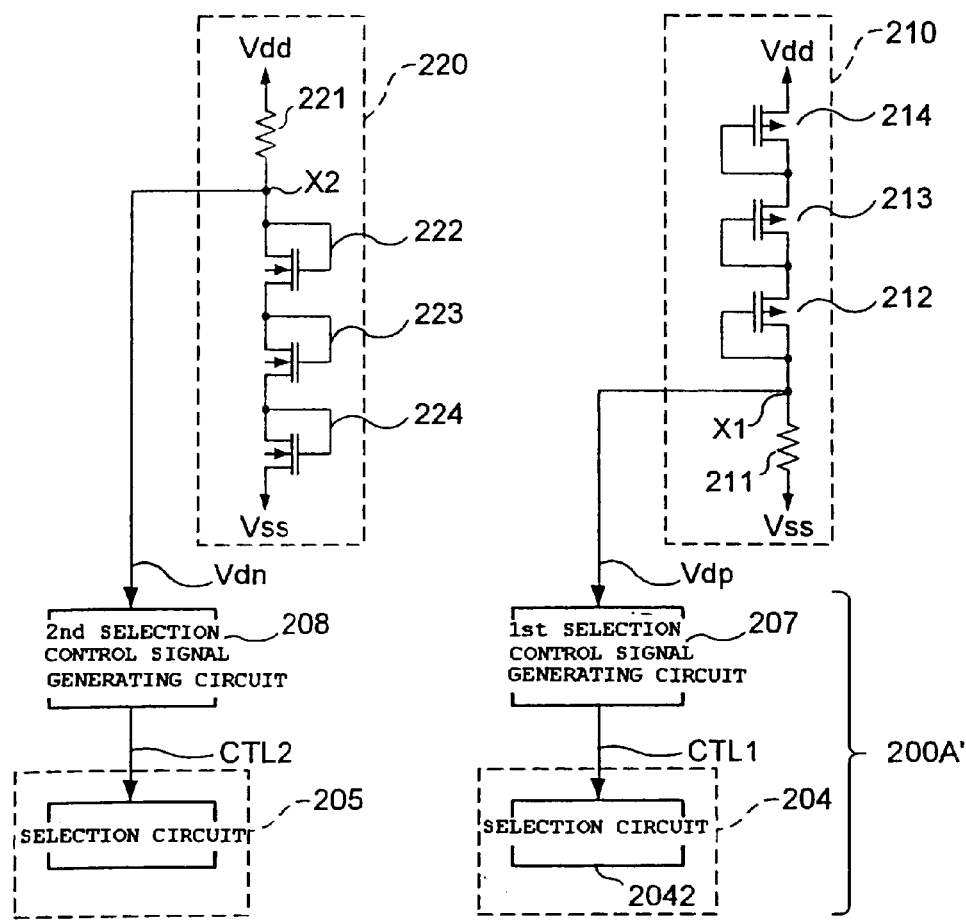
[FIG. 17]

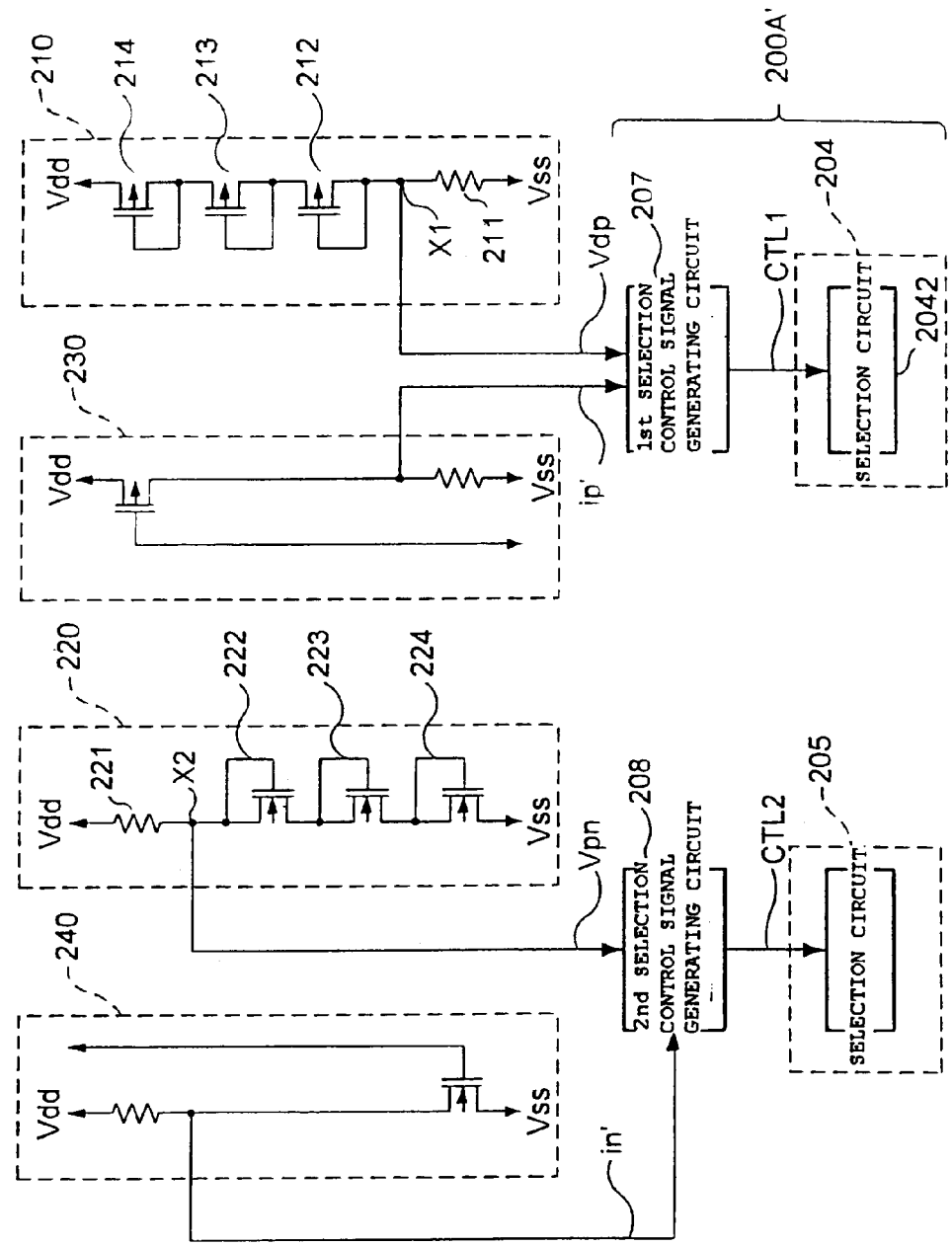
[FIG. 18]

[FIG. 19]
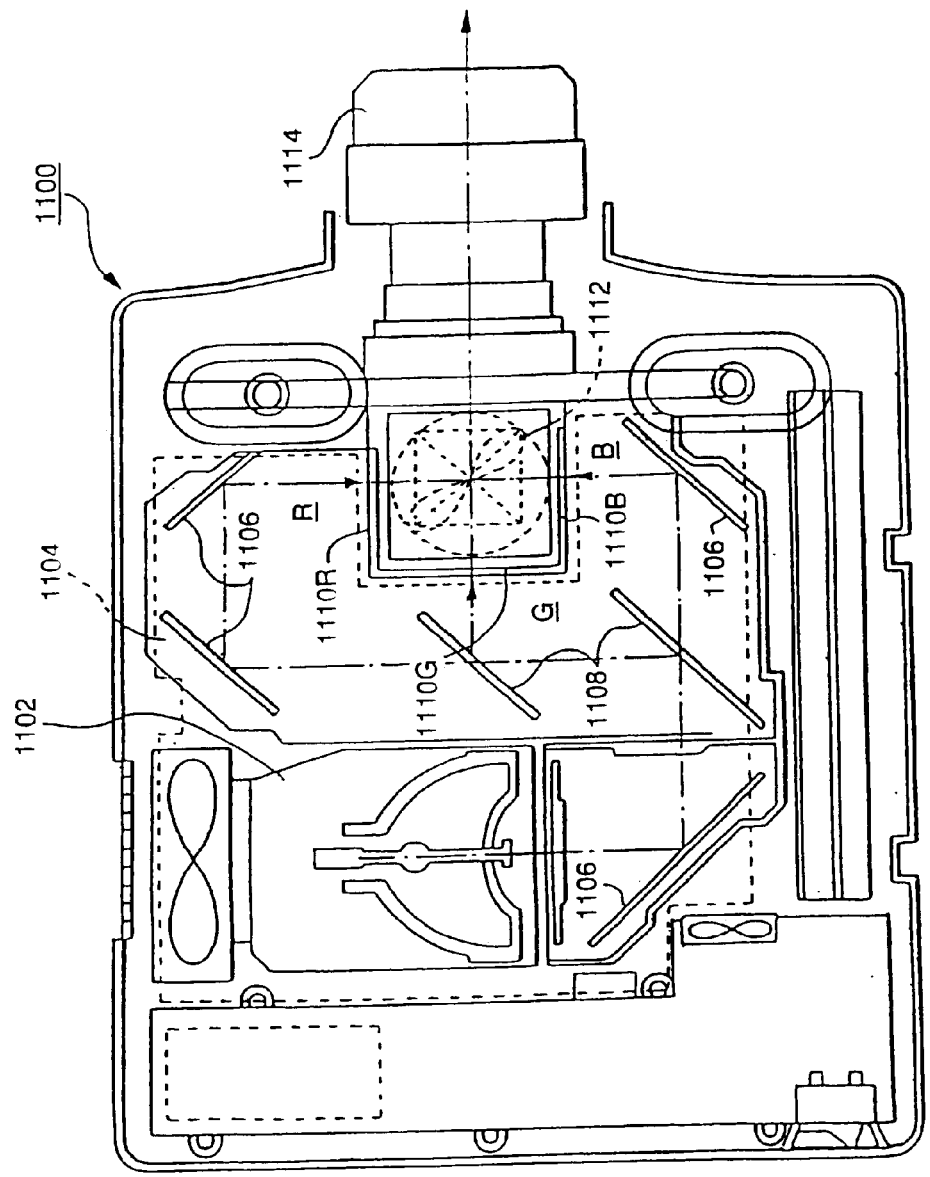

[FIG. 20]
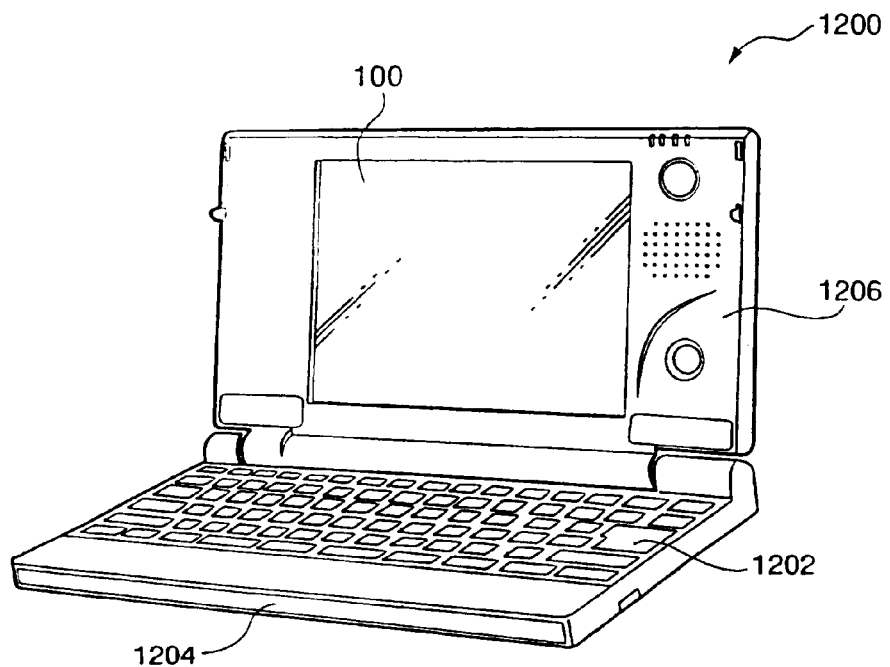
[FIG. 21]
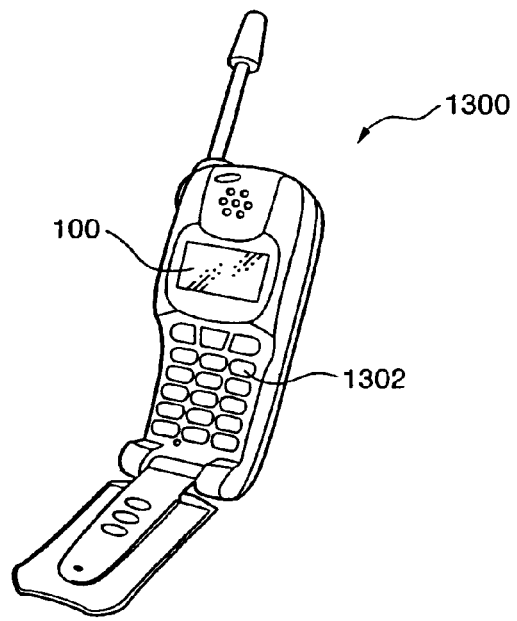

ELECTRO-OPTICAL DEVICE, CLOCK SIGNAL ADJUSTING METHOD AND CIRCUIT THEREFOR, PRODUCING METHOD THEREFOR, AND ELECTRONIC EQUIPMENT

BACKGROUND OF THE INVENTION

1. Field of Invention

The present invention relates to a malfunction-free electro-optical device, a clock signal adjusting method therefor, a clock signal adjusting circuit therefor, a producing method therefor, and electronic equipment using the electro-optical device.

2. Description of Related Art

A conventional electro-optical device, for example, a conventional active matrix liquid crystal display device includes a device substrate on which a switching device is provided at each of pixel electrodes arranged like a matrix, an opposing substrate on which color filters are formed, and liquid crystal filled between the substrates. In such a configuration, when a scanning signal is applied to a switching device through a scanning line, the switching device is conducted. When an image signal is applied to a pixel electrode through a data line during the switching device is in such a conducting state, a predetermined amount of electric charge is stored in a liquid crystal layer between the pixel electrode and an opposing electrode (or common electrode). Even when the switching device is turned off after the charge is stored, the stored charge is maintained in the case that the resistance of the liquid crystal layer is sufficiently high. Controlling an amount of stored charge by driving each switching device in this manner causes a change in the alignment of crystal liquid molecules at each pixel. This enables the display to indicate predetermined information.

At that time, the operation of storing charge in the liquid crystal layer of each pixel requires only part of processing time. Thus, a time division multiplexing driving method, according to which each of scanning lines and data lines is shared by a plurality of pixels, is implemented by first sequentially selecting scanning lines by means of a scanning line driving circuit, and second sequentially selecting one or more data lines by means of a data line driving circuit in a scanning line selecting time, and third sampling image signals and supplying the sampled image signals to the selected data lines.

Incidentally, generally, the scanning line driving circuit and the data line driving circuit are constituted by shift register circuits. According to a signal transferred by each of these shift register circuits, the scanning line driving circuit performs a vertical scanning operation, while the data line driving circuit performs a horizontal scanning operation.

Meanwhile, the scanning line driving circuit and the data line driving circuit may be formed on the aforementioned device substrate, in addition to an image display area including the scanning lines, data lines and switching devices. In such a case, a thin film transistor (hereunder referred to as TFT) is usually used as an active device constituting each of the scanning line driving circuit and the data line driving circuit.

Incidentally, in the case of some process for forming TFTs, there is variation in threshold voltage of a TFT. Especially, in the case of using a glass substrate as the device substrate, there is a large variation in the threshold voltage of a TFT.

On the other hand, each of the shift register circuits includes series-connected unit circuits, each of which includes a clocked inverter and a latch circuit. Each of the shift register circuits sequentially shifts a start pulse according to a clock signal and an inverted clock signal.

However, as described above, there is variation in threshold voltages of TFTs of the shift registers. Thus, when there is a certain difference between the threshold voltage and a designed value, each of the shift registers malfunctions. The operating speed of a TFT varies with the electric current value of an ON-current thereof. Thus, when there is a certain difference between the electric current value of the ON-current and a designed value, each of the shift registers malfunctions.

In such cases, even when the image display area normally operates, the liquid crystal panel should be rejected as a defective on the whole. Consequently, the conventional device has a drawback in that the yield of the liquid crystal panel is reduced.

SUMMARY OF THE INVENTION

The present invention is accomplished in view of the aforementioned circumstances. Accordingly, an object of the present invention is to provide a clock signal adjusting method and circuit, which can prevent the shift registers from malfunctioning, and to provide an electro-optical device and electronic equipment, to which the clock signal adjusting method and circuit are applied. Further, another object of the present invention is to provide an electro-optical devices producing method that can enhance the yield of the electro-optical devices when such devices are produced.

To achieve such objects, according to the present invention, there is provided a method of adjusting a clock signal in an electro-optical device having a display portion, which has a plurality of scanning lines, a plurality of data lines, and pixels provided respectively corresponding to intersections between the scanning lines and the data lines, and also having a shift register that sequentially shifts a start pulse according to a clock signal and an inverted clock signal. This method can be employed in the electro-optical device adapted to generate each of signals, which are supplied to the plurality of scanning lines and the plurality of data lines, according to each output signal of the shift register, and that the phases of the clock signal and the inverted clock signal to be supplied to the shift register are adjusted. Moreover, this method of the present invention comprises the steps of detecting a threshold voltage of each of transistors of the shift register, and adjusting the relative phases of the clock signal and the inverted clock signal according to the detected threshold voltage.

The turning on and off of the transistors of the shift register are controlled according to the clock signal and the inverted clock signal. It is determined by the threshold voltage of a transistor and a voltage supplied to the control terminal thereof whether the transistor is turned on or off. When the threshold voltage has a value that is higher or lower than a target value, the timing of switching between the on and off of the transistor shifts from intended timing. Even in such a case, according to the method of the present invention, the relative phases of the clock signal and the inverted clock signal are adjusted according to the threshold voltage of the transistor. Thus, the shift register can be normally operated.

Incidentally, preferably, at the step of detecting the threshold voltage of the transistor, a threshold voltage of a test transistor produced by the same manufacturing process as that of manufacturing the transistors of the shift register is measured. Moreover, the threshold voltage of each of transistors is detected according to a result of the measurement. The threshold voltages of the transistors produced by the same manufacturing process are equal to each other. Thus, the threshold voltage of the transistor of the shift register can be known by measuring the threshold voltage of such a test transistor. The present invention eliminates the necessity for directly measuring the threshold voltage of the transistor of the shift register. The threshold voltage of the transistor of the shift register can easily be detected by placing the test transistor in such a manner as to facilitate the measurement of the threshold voltage thereof.

Further, when the transistors of the shift register are a P-channel TFT and an N-channel TFT, preferably, at the step of measuring the threshold voltage, a first threshold voltage of the P-channel TFT and a second threshold voltage of the N-channel TFT are measured. Moreover, preferably, at the step of adjusting the phases of the clock signal and the inverted clock signal, the relative phases are adjusted according to the first and second threshold voltages. Thus, the relative phases can be adjusted according to the characteristics of the two kinds of transistors. Even when the threshold voltages of the P-channel TFT and the N-channel TFT are deviated from target values, the on/off timing of each of the TFTs can be adjusted to normal timing. Consequently, the shift register can be prevented from malfunctioning.

Furthermore, preferably, at the step of adjusting the phases, the relative phases of a leading edge of the clock signal and a trailing edge of the inverted clock signal are adjusted according to the first threshold voltage. In this case, the phase of the trailing edge of the inverted clock signal may be advanced and delayed with respect to the leading edge of the clock signal. Conversely, the phase of the leading edge of the clock signal may be advanced and delayed with respect to the trailing edge of the inverted clock signal.

Additionally, at the step of adjusting the phases, preferably, the relative phases of the trailing edge of the clock signal and the leading edge of the inverted clock signal are adjusted according to the second threshold voltage. In this case, the phase of the leading edge of the inverted clock signal may be advanced and delayed with respect to the trailing edge of the clock signal. Conversely, the phase of the trailing edge of the clock signal may be advanced and delayed with respect to the leading edge of the inverted clock signal.

Next, according to another aspect of the present invention, there is provided another method for use in an electro-optical device, which comprises the aforementioned prerequisites, and which further comprises the steps of detecting the threshold voltage and ON-current of each of transistors of the shift register, and adjusting the relative phases of the clock signal and the inverted clock signal according to the detected threshold voltage and ON-current.

When the magnitude of the ON-current of the transistor is large, the signal has high slew rate. Conversely, when the magnitude of the ON-current is low, the signal has low slew rate. Therefore, the on/off timing of the transistor of the shift register depends upon the ON-current. According to the present invention, the relative phases of the clock signal and the inverted clock signal are adjusted according not only to the threshold voltage of the transistor but also to the ON-current. Thus, when the magnitude of the ON-current of the transistor is deviated from the design target value according to the manufacturing process thereof, the shift register can be normally operated.

Incidentally, at the step of detecting a threshold voltage and an ON-current of each of transistors, preferably, the threshold voltage and ON-current of the test transistor produced is measured by the same manufacturing process as that of manufacturing the transistors of the shift register. Moreover, preferably, the threshold voltage and ON-current of each of the transistors is detected according to a result of the measurement. The present invention eliminates the need for directly measuring the threshold voltage of the transistor of the shift register. The threshold voltage and ON-current of the transistor of the shift register can easily be detected by placing the test transistor in such a manner as to facilitate the measurement of the threshold voltage thereof.

Further, when the transistors of the shift register are a P-channel TFT and an N-channel TFT, preferably, at the step of measuring the threshold voltage, the first threshold voltage and ON-current of the P-channel TFT and the second threshold voltage and ON-current of the N-channel TFT are measured. Moreover, preferably, at the step of adjusting the phases of the clock signal and the inverted clock signal, the relative phases are adjusted according to the first and second threshold voltages and the first and second ON-currents. Thus, the relative phases can be adjusted according to the characteristics of the two kinds of transistors. Even when the threshold voltages and ON-currents of the P-channel TFT and the N-channel TFT are deviated from target values, the on/off timing of each of the TFTs can be adjusted to normal timing. Consequently, the shift register can be prevented from malfunctioning.

Further, at the step of adjusting the phases of a leading edge of the clock signal and a trailing edge of the inverted clock signal, preferably, the relative phases can be adjusted according to the first threshold voltage and the first ON-current. In addition, at the step of adjusting the phases of a trailing edge of the clock signal and a leading edge of the inverted clock signal, preferably, the relative phases can be adjusted according to the second threshold voltage and the second ON-current.

Next, according to another aspect of the present invention, there is provided a clock signal adjusting circuit for use in an electro-optical device comprising a display portion, which has a plurality of scanning lines, a plurality of data lines, and pixels provided respectively corresponding to the intersections between the scanning lines and the data lines, and also having a shift register for sequentially shifting a start pulse according to a clock signal and an inverted clock signal. This clock signal adjusting circuit can be employed in the electro-optical device adapted to generate each of signals, which are supplied to the plurality of scanning lines and the plurality of data lines, according to each output signal of the shift register, and that the phases of the clock signal and the inverted clock signal to be supplied to the shift register are adjusted. Moreover, this clock signal adjusting circuit of the present invention comprises a first phase adjusting portion for adjusting the relative phases of a leading edge of the clock signal and a trailing edge of the inverted clock signal according to a threshold voltage of a transistor of the shift register, and a second phase adjusting portion for adjusting the relative phases of a trailing edge of the clock signal and a leading edge of the inverted clock signal according to the threshold voltage of a transistor of the shift register.

According to this clock signal adjusting circuit of the present invention, the relative phases of the clock signal and the inverted clock signal can be adjusted according to the threshold voltage of the transistor. Thus, even when the threshold voltage of the transistor is largely deviated from the design target value, such a shift register can be driven without malfunctioning.

Further, when the transistors of the shift register are a P-channel TFT and an N-channel TFT, preferably, the clock signal adjusting circuit of the present invention further comprises a first threshold voltage detecting portion that detects a first threshold voltage of the P-channel TFT, and a second threshold voltage detecting portion that detects a second threshold voltage detecting portion that detects a second threshold voltage of the N-channel TFT. Moreover, preferably, the first phase adjusting portion adjusts the relative phases of the leading edge of the clock signal and the trailing edge of the inverted clock signal according to the first threshold voltage, while the second phase adjusting portion adjusts the relative phase of the trailing edge of the clock signal and the leading edge of the inverted clock signal according to the second threshold voltage. According to the clock signal adjusting circuit of the present invention, the relative phases can be adjusted according to the characteristics of the two kinds of transistors of the shift register. Thus, the on/off timing of each of TFTs can be adjusted to the normal timing.

Incidentally, when the shift register normally shifts a start pulse in the case that an absolute value of the first threshold voltage is equal to a first reference voltage value and an absolute value of the second threshold voltage is equal to a second reference voltage value, preferably, the first phase adjusting portion delays the trailing edge of the inverted clock signal from the leading edge of the clock signal in the case that the absolute value of the first threshold voltage is lower than the first reference value and that the absolute value of the second threshold voltage is higher than the second reference voltage value. Furthermore, when the shift register normally shifts a start pulse in the case that an absolute value of the first threshold voltage is equal to a first reference voltage value and that an absolute value of the second threshold voltage is equal to a second reference voltage value, preferably, the first phase adjusting portion delays the trailing edge of the inverted clock signal from the leading edge of the clock signal in the case that the absolute value of the first threshold voltage is higher than the first reference value and that the absolute value of the second threshold voltage is lower than the second reference voltage value.

Additionally, preferably, at least the first and second threshold voltage detecting portions are formed on the same substrate on which the shift register is formed. Furthermore, it is preferable that the first threshold voltage detecting portion has and uses a P-channel TFT formed in the same process as a process, in which the P-channel TFT of the shift register is formed, to thereby detect the first threshold voltage, and that the first threshold voltage detecting portion has and uses an N-channel TFT formed in a same process as a process, in which the N-channel TFT of the shift register is formed, to thereby detect the second threshold voltage.

Next, according to another aspect of the present invention, there is provided another clock signal adjusting circuit for use in an electro-optical device, which has the aforementioned requisites and further comprises a first phase adjusting portion that adjusts the relative phases of a leading edge of the clock signal and a trailing edge of the inverted clock signal according to the threshold voltage and ON-current of a transistor of the shift register, and a second phase adjusting portion that adjusts the relative phases of a trailing edge of the clock signal and a leading edge of the inverted clock signal according to the threshold voltage and ON-current of a transistor of the shift register.

According to this clock signal adjusting circuit of the present invention, the relative phases of the clock signal and the inverted clock signal are adjusted according not only to the threshold voltage of the transistor but also to the ON-current. Thus, when the magnitude of the ON-current of the transistor is deviated from the design target value according to the manufacturing process thereof, the shift register can be normally operated.

Further, when the transistors of the shift register are a P-channel TFT and an N-channel TFT, preferably, the clock signal adjusting circuit further comprises a first threshold voltage detecting portion that detects a first threshold voltage of the P-channel TFT, a second threshold voltage detecting portion that detects a second threshold voltage of the N-channel TFT, a first ON-current detecting portion that detects a first ON-current of the P-channel TFT, and a second ON-current detecting portion that detects a second ON-current detecting portion that detects a second ON-current of the N-channel TFT. Moreover, preferably, the first phase adjusting portion adjusts the relative phases of the leading edge of the clock signal and the trailing edge of the inverted clock signal according to the first threshold voltage and ON-current, while the second phase adjusting portion adjusts the relative phases of the trailing edge of the clock signal and the leading edge of the inverted clock signal according to the second threshold voltage and ON-current.

Furthermore, the first phase adjusting portion may increase a delay time of the trailing edge of the inverted clock signal with respect to the leading edge of the clock signal as the first ON-current increases. Further, the second phase adjusting portion may increase a delay time of the leading edge of the clock signal with respect to the trailing edge of the inverted clock signal as the second ON-current increases.

Additionally, in the clock signal adjusting circuit for use in an electro-optical device, preferably, the shift register is constituted by cascade-connecting a plurality of unit circuits. Moreover, preferably, each of the unit circuits comprises a first inverter being supplied with an input signal of the unit circuit and a latch circuit that comprises a second inverter, which is operative to invert an output signal of the first inverter and to output a resultant signal as an output signal of the unit circuit, and a third inverter, which is operative to invert an output signal of the second inverter and to supply the inverted signal to an input terminal of the second inverter. Furthermore, preferably, the first inverter is configured so that the first inverter has a first P-channel TFT, a second P-channel TFT, a first N-channel TFT, and a second N-channel TFT, which are serially series-connected between a positive power supply and a negative power supply, that an output signal of the first inverter is fetched from a connecting point between the second P-channel TFT and the first N-channel TFT, that a gate of the second P-channel TFT is connected to the gate of the first N-channel TFT, that an input signal to a corresponding one of the plurality of unit circuits is supplied to a connecting point between the second P-channel TFT and the first N-channel TFT, that a clock signal is supplied to a gate of the first P-channel TFT of each odd-numbered one of the plurality of unit circuits, that an inverted clock signal is supplied to a gate of the second N-channel TFT of each odd-numbered one of the plurality of unit circuits, and that an inverted clock signal is supplied to a gate of the first P-channel TFT of each even-numbered one of the plurality of unit circuits, that an clock signal is supplied to a gate of the second N-channel TFT of each even-numbered one of the plurality of unit circuits.

Next, according to the present invention, there is provided an electro-optical device of the present invention that comprises a display portion having a plurality of scanning lines, a plurality of data lines, and pixels provided respectively corresponding to the intersections between the plurality of scanning lines and the plurality of data lines, a shift register that sequentially shifts a start pulse according to a clock signal and an inverted clock signal, a driving portion that generates signals to be supplied to the plurality of scanning lines and the plurality of data lines, and the aforementioned clock signal adjusting circuit. According to this electro-optical device of the present invention, almost no malfunction of the shift register occurs. Consequently, the picture quality of a displayed image can be enhanced.

Further, according to the present invention, there is provided electronic equipment that uses the aforementioned electro-optical device as display means. Examples of this electronic equipment are a hand-portable telephone set, a video projector, and a view-finder of a camcorder.

Next, according to the present invention, there is provided a method of producing an electro-optical device having the following requisites, that is, a display panel, which has a display portion including a plurality of scanning lines, a plurality of data lines, and pixels respectively provided correspondingly to the intersections between the scanning lines and the data lines, and also has a driving portion that drives the display portion by using a shift register, and also having a clock signal generating circuit enabled to generate a clock signal and an inverted clock signal, which are supplied to the shift register, and to adjust the relative phases of the clock signal and the inverted clock signal. Further, this method comprises the steps of manufacturing the display panel, measuring a threshold voltage of each of transistors of the shift register of the manufactured display panel, and adjusting the relative phases of the clock signal and the inverted clock signal according to the measured threshold voltage.

According to this method of the present invention, when the display panel is produced, the relative phases of the clock signal and the inverted clock signal can be adjusted even in the case that the threshold voltage of each of the transistors is largely deviated from the design target value. Thus, the shift register can be normally operated. Consequently, even a display panel, which has hitherto been treated as a defective, can be treated as a quality item. Therefore, the yield of the display panel can be considerably enhanced. Consequently, the manufacturing cost of the electro-optical device can be reduced.

BRIEF DESCRIPTION OF THE DRAWINGS

FIG. 1 is a schematic illustrating the entire configuration of a liquid crystal display device, which is an embodiment of the present invention.

FIG. 2 is a schematic illustrating the configuration of a primary portion of a first clock signal generating circuit of the device.

FIG. 3 is a timing chart illustrating the waveform of a signal flowing through each portion of the first clock signal generating circuit.

FIG. 4 is a schematic illustrating the configuration of a scanning line driving circuit of the device.

FIGS. 5(a) and (b) are circuit diagrams each illustrating the configuration of a clocked inverter of a unit circuit of the scanning line driving circuit.

FIG. 6 is a circuit diagram illustrating the configuration of an inverter of a unit circuit of the scanning line driving circuit.

FIG. 7 is a timing chart illustrating a normal operation of the scanning line driving circuit.

FIG. 8 is a perspective diagram illustrating the configuration of the liquid crystal panel.

FIG. 9 is a partially sectional diagram illustrating the configuration of the liquid crystal panel.

FIG. 10 is a timing chart illustrating an operation of a shift register in the case that a threshold voltage of a P-channel TFT is lower by $\Delta$Vp.

FIG. 11 is a circuit diagram illustrating unit circuits of the shift register.

FIG. 12 is a timing chart illustrating an operation of the shift register upon completion of a first adjustment at a third step in an example illustrated in FIG. 10.

FIG. 13 is a timing chart illustrating an operation of the shift register upon completion of a second adjustment at the third step in an example illustrated in FIG. 10.

FIG. 14 is a timing chart illustrating an operation of the shift register in the case that a threshold voltage of an N-channel TFT is higher by $\Delta$Vp.

FIG. 15 is a timing chart illustrating an operation of the shift register upon completion of a first adjustment at a third step in an example illustrated in FIG. 14.

FIG. 16 is a timing chart illustrating an operation of the shift register upon completion of a second adjustment at the third step in an example illustrated in FIG. 14.

FIG. 17 is a schematic illustrating a primary portion of the first clock signal generating circuit, which is operative to automatically adjust the relative phase of a clock signal, and also illustrating the peripheral circuit thereof.

FIG. 18 is a schematic illustrating a modification of the first clock signal generating circuit shown in FIG. 17.

FIG. 19 is a sectional diagram illustrating a projector that is an example of electronic equipment to which the liquid crystal display is applied.

FIG. 20 is a perspective diagram illustrating a personal computer that is an example of electronic equipment to which the liquid crystal display is applied.

FIG. 21 is a perspective diagram illustrating a hand-portable telephone set that is an example of electronic equipment to which the liquid crystal display is applied.

DETAILED DESCRIPTION OF PREFERRED EMBODIMENTS

Hereinafter, an embodiment of the present invention is described with reference to the accompanying drawings.
Entire Configuration of Electro-optical Device First, a liquid crystal display device will be described hereinbelow as an example of an electro-optical device according to the embodiment. FIG. 1 is a schematic illustrating the electrical configuration of this liquid crystal display device. As shown in this figure, the liquid crystal device has a liquid crystal panel 100, a timing generator 200, and an image signal processing circuit 300. Among these constituent elements, the timing generator 200 is operative to output timing signals (to be described later when necessary) to be used in various portions. Further, when an image signal VID of a system is inputted, a S/P conversion circuit 302 provided in the image signal processing circuit 300 performs serial-parallel conversion of the image signal VID into image signals of six phases VID1 to VID6 and outputs these signals. Incidentally, the reason for performing the serial-parallel conversion of the image signal into signals of six phases is that sufficient sample-and-hold period and charging/discharging period are ensured by increasing a period, in which image signals are applied to the source region of each of TFTs serving as switching devices by a sampling circuit (to be described later).

On the other hand, an amplification and inversion circuit 304 is operative to invert image signals, the inversion of which is needed, among the serial-parallel converted image signals and to then suitably amplify the image signals and perform the parallel supply of image signals VID1 to VID6 to the liquid crystal panel 100. Incidentally, generally, whether or not the image signals are inverted is determined according to the method of application of data signals, which is performed by selecting one of the following manners of inversion of the polarity of voltage, that is, (i) the inversion of the polarity is performed scanning-line by scanning-line, (ii) that of the polarity is performed by data-line by data-line, (iii) that of the polarity is performed by pixel by pixel, and (iv) that of the polarity is performed by picture by picture. An inversion period is set at one horizontal scanning period, or a dot clock signal period, or a vertical scanning period. Incidentally, in this embodiment, the inversion of the polarity is defined as the switching of the voltage level of an image signal between the levels respectively corresponding to positive and negative polarities and determined with respect to the potential corresponding to the amplitude center of the image signal.

Configuration of Liquid Crystal Panel

Next, the electrical configuration of the liquid crystal panel 100 is described hereinbelow. As will be described later, the liquid crystal panel 100 is constituted by attaching the device substrate and the opposing substrate so that the electrode forming surfaces thereof are opposed to each other. Between these substrates, on the device substrate, a plurality of parallel scanning lines 112 are formed and arranged in such a way as to extend in the X-direction, as shown in this figure. Moreover, a plurality of parallel data lines 114 are formed in such a manner as to extend along the Y-direction perpendicular to the X-direction. Further, at the intersections between the scanning lines 112 and the data lines 114, the gate electrodes of TFTs 116 are respectively connected to the scanning lines 112, while the source electrodes of the TFTs 116 are respectively connected to the data lines 114. Moreover, the drain electrodes of the TFTs 116 are connected to pixel electrodes 118, respectively. Furthermore, each of the pixels consists of the pixel electrode 118, a common electrode formed on the opposing substrate (to be described later), and a liquid crystal layer sandwiched between both the electrodes. Thus, the pixels are arranged like a matrix in such a way as to respectively correspond to the intersections between the scanning lines 112 and the data lines 114. Incidentally, in addition to such components, a storage capacitor (not shown) may be formed in such a manner as to electrically parallel to the liquid crystal layer sandwiched between the pixel electrode 118 and the common electrode.

Meanwhile, the driving circuit 120 includes a data line driving circuit 130, a sampling circuit 140, and a scanning line driving circuit 150. The driving circuit 120 is formed on a peripheral portion of the display area of the opposing surface of the device substrate. Each of active devices of these circuits can be formed by the combination of P-channel TFTs and N-channel TFTs, as will be described later. Thus, it is advantageous in integration, manufacturing cost, and uniformity of devices to form such an active device in a common manufacturing process (for example, a process whose process temperature is about 1000° C.) by which TFTs 116 for switching the pixels are manufactured.

Incidentally, among the components of the driving circuit 120, the data line driving circuit 130 has a shift register and is operative to sequentially output sampling signals S1 to Sm according to clock signals CLX received from the timing generator 200 and the inverted clock signal CLXINV obtained by inverting the clock signal CLX.

The sampling circuit 140 is operative to sample the image signals VID1 to VID6 according to sampling signals S1 to Sm and output the sampled image signals to data lines 114 of groups, each of which includes 6 data lines. Particularly, in the sampling circuit 140, a switch 141 constituted by a TFT is provided at an end of the data lines 114. The source electrode of each of the switches 141 is connected to a signal line to which one of the image signals VID1 to VID6 is supplied. Further, the drain electrode of the each of the switches 141 is connected to the single data line 114. Furthermore, the gate electrode of each of the switches 141 connected to the data lines 114 of each of the groups is connected to a signal line to which the sampling signals S1 to Sm are supplied correspondingly to the corresponding group. As described above, in this embodiment, the image signals VID1 to VID6 are simultaneously supplied to the data lines. Thus, the image signals VID1 to VID6 are simultaneously sampled according to the sampling signal S1. Incidentally, in the case of supplying the image signals VID1 to VID6 with timing, with which the image signals are sequentially shifted, the image signals are sequentially sampled according to the sampling signals S1, S1, . . . .

The scanning line driving circuit 150 has a shift register and is operative to serially output scanning signals to the scanning lines 112 according to the clock signals CLY, inverted clock signals CLYINV, and a transfer start pulse DY from the timing generator 200.

Timing Generator

Next, a clock signal generating circuit, which is a primary part of the timing generator 200, is described hereinbelow. The clock signal generating circuit includes a first clock signal generating circuit 200A and a second clock signal generating circuit 200B. The first clock signal generating circuit 200A is operative to generate the clock signals CLY and the inverted clock signals CLYINV, which are supplied to the shift register of the scanning line driving circuit 150. On the other hand, the second clock signal generating circuit 200B is operative to generate the clock signals CLX and the inverted clock signals CLXINV, which are supplied to the shift register of the data line driving circuit 130.

The first clock signal generating circuit 200A and the second clock signal generating circuit 200B are of the same configuration and differ from each other only in the period of trigger pulses TP to be supplied thereto. Therefore, only the first clock signal generating circuit 200A is described hereinbelow.

FIG. 2 is a schematic illustrating the configuration of a primary portion of the first clock signal generating circuit 200A. FIG. 3 is a timing chart illustrating the waveform of a signal flowing through each of portions of the first clock signal generating circuit 200A.

As shown in FIG. 2, the first clock signal generating circuit 200A includes a trigger flipflop 201, a delay circuit 202, a distribution circuit 203, a trailing edge control circuit 204, a leading edge control circuit 205, and a set-reset flipflop 206.

First, a trigger pulse TP is supplied to the clock terminal of the trigger flipflop 201 from another composing portion of the timing generator 200. Incidentally, the trigger pulse TP is a signal having a constant period, as illustrated in FIG. 3(a), and used for determining the timing with which a leading edge and a trailing edge of the clock signal CLY are generated. Further, one period of the trigger pulse TP is set in such a way as to coincide with a half of the period TC of the clock signal CLY to be generated. The trigger flipflop 201 generates the clock signal CLY, which is shown in FIG. 3(b), in synchronization with the trigger pulse TP.

Further, the delay circuit 202 is constituted by a multi-stage connection of an even number of inverters. The delay time of this delay circuit 202 is TD that is set in such a way as to be slightly shorter than a half of the period TC of the clock signal CLY, as illustrated in FIG. 3. The trigger pulse TP is delayed by this delay circuit 202. Further, a delayed trigger pulse TP', which is delayed from the trigger pulse TP by the time TD, is generated by this delay circuit 202 (see FIG. 3(c)).

Moreover, the distribution circuit 203 is adapted to distribute the delayed trigger pulse TP' according to the clock signal CLY. Practically, the distribution circuit 203 supplies the delayed trigger pulse TP', which is generated during the clock signal CLY has an L level, to the trailing edge control circuit 204 as a trailing trigger pulse DTP (see FIG. 3(d)), while the circuit 203 supplies the delayed trigger pulse TP', which is generated during the clock signal CLY has an H level, to the trailing edge control circuit 204 as a leading trigger pulse UTP (see FIG. 3(e)).

Furthermore, the trailing edge control circuit 204 comprises eight delay circuits 2041a to 2041g, a selection circuit 2042, a DIP switch 2043, and a ladder resistor 2044. Each of the delay circuits 2041a to 2041g can be constituted by an even number of inverters, similarly as the aforementioned delay circuit 202. Furthermore, the delay time td of each of the delay circuits 2041a to 2041g is td. In this example, the delay time td is set so that TC=TD+3td where TC is a half of the period of the clock signal CLY.

Thus, the phase of an output signal of the delay circuit 2041c coincides with that of the trigger pulse TP. In other words, when a trailing edge of the inverted clock signal CLYINV is generated according to the output signal of the delay circuit 2041c, the leading edge of the clock signal CLY and the trailing edge of the inverted clock signal CLYINV can be generated at the same time.

Furthermore, when the trailing edge of the inverted clock signal CLYINV is generated according to each of output signals of the trigger pulse DTP and the trigger delay circuits 2041a and 2041b, the phase of the trailing edge of the inverted clock signal CLYINV can be advanced from that of the leading edge of the clock signal CLY.

Additionally, when the trailing edge of the inverted clock signal CLYINV is generated according to each of the output signals of the trigger delay circuits 2041d and 2041g, the trailing edge of the inverted clock signal CLYINV can be delayed from that of the leading edge of the clock signal $CLY_{INV}$.

The selection circuit 2042 is operative to select one of the trailing trigger pulse DTP and output signals of the delay circuits 2041 according to a three-bit selection control signal CTL and to output the selected pulse or signal as the adjusted trailing trigger pulse DTP'. Furthermore, a selection control signal CTL is inputted to the selection circuit 2042 by setting a three-bit DIP switch 2043.

Incidentally, FIG. 3(f) is drawn by quadrupling the scale spacing of the time axis of the trailing trigger pulse DTP illustrated in FIG. 3(d). In this case, the phase of each of output signals of the delay circuits 2041a to 2041g is delayed from that of the trailing trigger pulse DTP so that a corresponding delay time is increased by a time td in the order from the delay circuit 2041a to the delay circuit 2041g, as illustrated in FIGS. 3(g) to 3(m).

Further, the leading edge control circuit 205 has a configuration similar to that of the trailing edge control circuit 204, and is adapted to receive the leading trigger pulse UTP and output an adjusted leading trigger pulse UTP'.

Moreover, the set-reset flipflop 206 has the H level in synchronization with the adjusted leading trigger pulse UTP', and generates the inverted clock signal CLYINV, which has the L level in synchronization with the adjusted trailing trigger pulse DTP'.

With the aforementioned configuration, the relative phase of the trailing edge of the inverted clock signal CLYINV with respect to that of the leading edge of the clock signal CLY can be adjusted by changing the setting of a DIP switch 2043 of the trailing edge control circuit 204. Further, the relative phase of the leading edge of the inverted clock signal CLYINV with respect to that of the trailing edge of the clock signal CLY can be adjusted by changing the setting of a DIP switch 2043 of the leading edge control circuit 205.

For example, in the case of delaying the relative phase of the trailing edge of the inverted clock signal CLYINV with respect to that of the leading edge of the clock signal CLY by a time td and causing the phase of the leading edge of the inverted clock signal CLYINV to coincide with the phase of the trailing edge of the clock signal CLY, it is sufficient that data "011" is set in the DIP switch 2043 of the trailing edge control circuit 204, and that data "010" is set in the DIP switch of the leading edge control circuit 205. In this case, an output signal of the delay circuit 2041c shown in FIG. 3(j) is selected as the adjusted trailing trigger pulse DTP', so that the adjusted leading trigger pulse UTP' shown in FIG. 3(n) is selected. Thus, the set-reset flipflop 206 generates the inverted clock signal CLYINV shown in FIG. 3(o). As compared with the clock signal CLY shown in FIG. 3(p), the phase of the trailing edge of the inverted clock signal CLYINV shown in FIG. 3(o) is delayed by a time td.

Configuration of Scanning Line Driving Circuit

Next, the scanning line driving circuit 150 according to this embodiment is described hereinbelow. The scanning line driving circuit 150 is operative to sequentially output scanning signals Y1 to Yn-1 according to the clock signal CLY and the inverted clock signal CLYINV, which are sent from the timing generator 200.

FIG. 4 is a schematic illustrating the configuration of the scanning line driving circuit 150. In the circuit illustrated in this figure, the clock signal CLY, the inverted clock signal CLYINV, a pulse DY and a signal EN are supplied by the timing generator 200 in synchronization with the image signals VID1 to VID6.

First, reference character TEG1 designates an N-channel TFT for measuring the drain-current characteristic thereof. Reference character TEG2 denotes a P-channel TFT for measuring the drain-current characteristic thereof. The TFTs TEG1 and TEG2 are produced by performing the same process as that for producing TFTs of the scanning line driving circuit 150.

Therefore, the threshold voltages and ON-currents of the N-channel TFT and the P-channel TFT of the scanning line driving circuit 150 can be known by measuring the drain-current characteristics of the TFTs TEG1 and TEG2. The drain-current characteristics thereof are measured by connecting the terminals Tn1 to Tn3 of the TFT TEG1 and the terminals Tp1 to Tp3 of the TFT TEG2 to a measuring device after the liquid crystal panel 100 is manufactured. Details of this operation will be described later.

Incidentally, although the TFTs TEG1 and TEG2 are produced in the scanning line driving circuit 150 in the case of this example, the TFTs TEG1 and TEG2 may be produced on any peripheral portion of the device substrate 101. Further, the TFTs of the data line driving circuit 130 are manufactured by the same process as that for producing the TFTs TEG1 and TEG2 and the scanning line driving circuit 150. Thus, the threshold voltages and ON-currents of the N-channel TFT and the P-channel TFT of the data line driving circuit 130 can be known by measuring the drain-current characteristics of the TFTs TEG1 and TEG2.

Further, each of level shifters (LS) 1512 and 1514 is operative to convert the clock signal CLY and the inverted clock signal CLYINV, which have low logical amplitude levels, into signals having high logical amplitude levels and to output the converted signals. Incidentally, the reason for converting the logical amplitude levels by using the level shifters 1512 and 1514 is that the timing generator 200 (see FIG. 1) that supplies various timing signals to the liquid crystal panel 100 is generally constituted by a CMOS circuit and thus outputs an output voltage of 3 to 5 V, that in contrast, the constituent devices of the data line driving circuit 130 are TFTs formed on the device substrate by the same process as that for producing the TFT 116 that switch the pixels and thus require a relatively high operating voltage of 12 V or so, and that the data line driving circuit 130 adapted to perform a logical operation in synchronization with the clock signal requires an operating voltage in the same order as that required by the constituent device of the data line driving circuit 130. Incidentally, although not illustrated in this figure, signals having high logical amplitude levels, to which signals having low logical amplitude levels are converted by similar level shifters, are used as the pulse DY and the signal EN.

Further, a shift register 1550 is constituted by cascade-connecting unit circuits R1 to Rn (n is a natural number), and adapted to output the pulses DY, which are supplied at the beginning of a vertical scanning period, according to the cock signal CLY and the inverted clock signal CLYINV, which are converted into signals having high logical amplitude levels, by shifting a unit circuit, which currently outputs the pulse, from a front-stage one (namely, the leftmost-side one) to a rear-stage one (namely, the rightmost-side one), as viewed in this figure. Incidentally, for convenience of description, in this embodiment, the shift register is constituted by cascade-connecting an odd number of stages of unit circuits.

Among these unit circuits R1 to Rn, the unit circuits R1, R3, . . . , Rn–2, Rn of odd-numbered stages include clocked inverters 1552 each operative to invert an input signal when the clock signal CLY has the H level (that is, the inverted clock signal CLYINV has the L level), and also include inverters 1554 each operative to reinvert the signal inverted by the clocked inverter 1552, and clocked inverters 1556 each operative to invert an input signal when the clock signal CLY has the L level (that is, the inverted clock signal CLYINV has the H level).

Hereinafter, the practical configuration of the clocked inverter 1552 of the unit circuit of each odd-numbered stage is described. As illustrated in FIG. 5(*a*), a P-channel TFT adapted so that the inverted clock signal CLYINV is inputted to the gate electrode thereof, a complementary P-channel TFT and a complementary N-channel TFT, each of which is adapted so that an input signal is inputted to the gate electrode thereof, an N-channel TFT, and another N-channel TFT having a gate electrode, to which the clock signal CLY is inputted, are series-connected between a high-order-side power supply Vdd and a low-order-side power supply Vss. Further, as illustrated in FIG. 5(*b*), in the case of the clocked inverter 1556 of each odd-numbered stage, the TFT, to which the clock signal is supplied, and the TFT, to which the inverted clock signal CLYINV is inputted, of the case illustrated in FIG. 5(*a*) are interchanged with each other. Moreover, as illustrated in FIG. 6, in the case of the inverter 1554, a P-channel TFT and an N-channel TFT are complementarily series-connected between the high-order-side power supply Vdd and the low-order-side power supply Vss.

On the other hand, among the unit circuits R1 to Rn, the unit circuits of even-numbered stages R2, R4, . . . , Rn–1 are basically configured similarly as in the case of the unit circuits of the odd-numbered stages R1, R3, . . . , Rn–2, Rn. However, the unit circuits of even-numbered stages R2, R4, . . . , Rn–1 differ from the unit circuits of the odd-numbered stages, only in that the clocked inverter 1552 inverts the input signal when the clock signal CLY has the L level, and that the clocked inverter 1556 inverts the input signal when the clock signal CLY has the H level. Therefore, the clocked inverter 1552 of each even-numbered stage has the configuration illustrated in FIG. 5(*b*), while the clocked inverter 1556 of each even-numbered stage has the configuration illustrated in FIG. 5(*a*). Consequently, in the case of each even-numbered stage, the clocked inverter 1552 and 1556 of each odd-numbered stage are interchanged with each other.

Incidentally, although FIG. 4 illustrates that only the clock signals CLY are supplied to the clocked inverter 1552 of each odd-numbered stage and to the clocked inverter 1556 of each even-numbered stage, actually, the inverted clock signals CLYINV are also supplied thereto, as illustrated in FIG. 5(*a*). Similarly, although FIG. 4 illustrates that only the inverted clock signals CLYINV are supplied to the clocked inverter 1556 of each odd-numbered stage and to the clocked inverter 1552 of each even-numbered stage, actually, the clock signals CLY are also supplied thereto, as illustrated in FIG. 5(*b*). Further, these clocked inverters and inverters are connected between the high-order-side power supply Vdd and the low-order-side power supply Vss, so that a power supply wire is routed to each of the unit circuits.

Further, as illustrated in FIG. 4, a NAND circuit 1576, an inverter 1578, and an AND circuit 1579 are provided correspondingly to each of the second to nth stages, and complementarily constituted by a combination of P-channel TFTs and N-channel TFTs.

Among these circuits, as viewed in this figure, the ith NAND circuit 1576 (i=2, . . . , n) from the leftmost end is operative to invert a logical product of an output signal of the unit circuit of an (i–1)th stage and an output signal of the unit circuit of an ith stage.

Further, the inverter 1578 of each of the stages is operative to invert an output signal of the corresponding NAND circuits 1578. Furthermore, the AND circuit 1579 of each of the stages is operative to output logical products of an output signal of the corresponding inverter 1578 and the signal EN as scanning signals Y1, Y2, . . . , Yn–1.

Operation of Scanning Line Driving Circuit

Next, a normal operation of the scanning line driving circuit 150 is described hereinbelow. Incidentally, FIG. 7 is a timing chart of a normal operation of the scanning line driving circuit 150. First, at a time T11, the pulse DY is inputted at the beginning of a vertical scanning period. Moreover, the clock signal CLY rises (or the inverted clock signal CLYINV falls). Then, in the shift register 1550, the clocked inverter 1552 of the unit circuit R1 of the first stage inverts the H level of the pulse DY. Furthermore, the inverter 1554 of the unit circuit R1 of the first stage inverts a resultant signal obtained by the inversion performed at the inverter 1552. Consequently, an output signal A of the unit circuit R1 of the first stage has the H level.

Subsequently, at a time t12, the clock signal CLY falls (or the inverted clock signal CLYINV rises) during a period in which the pulse DY is inputted. Then, the clocked inverter 1556 of the unit circuit R1 of the first stage provides the inverted feedback of the output signal A having the H level to the inverter 1554. Thus, the output signal A maintains the signal level thereof at the H level. Further, the clocked inverter 1552 of the unit circuit R2 of the second stage inverts the H level of the output signal A obtained by the unit circuit R1 of the first stage. Moreover, the inverter 1556 of the unit circuit R2 of the second stage inverts a resultant signal obtained by the inversion performed at the clocked inverter 1552. Thus, an output signal B of the unit circuit R2 of the second stage has the H level.

Then, at a time t13, the input of the pulse DY is terminated. Further, the clock signal CLY rises again (or the inverted clock signal CLYINV falls), the clocked inverter 1552 of the unit circuit R1 of the first stage takes in the pulse DY having the L level. Thus, an output signal A of the unit circuit R1 has the L level. On the other hand, the clocked inverter 1556 of the unit circuit R2 of the second stage provides the inverted feedback of the output signal B of the H level to the inverter 1554. Thus, the output signal B maintains the signal level thereof at the H level. Further, the clocked inverter 1552 of the unit circuit R3 of the third stage inverts the H level of the output signal B obtained by the unit circuit R2 of the second stage. Moreover, the clocked inverter 1552 of the unit circuit R3 of the third stage inverts the H level of the output signal B obtained by the second unit circuit R2 of the second stage. Furthermore, the inverter 1554 of the unit circuit R2 of the second stage inverts a resultant signal obtained by the inversion performed at the clocked inverter 1552. Consequently, an output signal C of the unit circuit R3 of the third stage has the H level.

Then, similar operations are repeated. Thus, the pulse DY is successively shifted by a half of the period of each of the clock signal CLY and the inverted clock signal CLYINV at a time. Consequently, the shifted pulse is outputted as output signals A, B, C, . . . . From the unit circuits R1 to Rn.

Such signals A, B, C, . . . are inverted by the inverter 1578, so that the duration of the inverted signals are limited to the pulse width of the signal EN. Subsequently, resultant signals are outputted as scanning signals Y1 to Yn−1.

Data Line Driving Circuit

Next, the data line driving circuit 130 is described hereinbelow. However, basically, the configuration thereof is similar to that of the scanning line driving circuit 150, except that the data line driving circuit 130 differs from the scanning line driving circuit 150 in the direction of deriving an output signal and in the input signal to be inputted thereto. That is, the data line driving circuit 130 is equivalent to a circuit obtained by leftwardly rotating the scanning line driving circuit 150 by 90 degrees and placing thereof. As illustrated in FIG. 1, a pulse DX is inputted instead of the pulse DY. Moreover, a clock signal CLX and an inverted clock signal CLXINV are inputted thereto in each horizontal scanning period, instead of the clock signal CLY and an inverted clock signal CLYINV.

Configuration of Example of Liquid Crystal Panel

Next, the entire constitution of the liquid crystal panel 100 in the aforementioned electrical configuration is described hereinbelow with reference to FIGS. 8 and 9. Incidentally, FIG. 8 is a perspective diagram illustrating the constitution of the liquid crystal panel 100. FIG. 9 is a sectional diagram taken along the line Z–Z'.

As illustrated in these figures, the liquid crystal panel 100 has the following constitution. That is, the device substrate 101, which is made of glass and semiconductor material and has the pixel electrodes 118 formed thereon, and the transparent opposing substrate 102, which is made of glass and has the common electrodes 108 formed thereon, are bonded so that the electrode forming surfaces of these substrates are opposed to each other, so that a uniform gap is formed between the substrates by sealing material 104 into which spacers are mixed, and that liquid crystal 105 serving as electro-optical material is filled in this gap. Incidentally, the sealing material 104 is formed along the periphery of the opposing substrate 102 and is partly opened to fill the gap with the liquid crystal 105. Thus, after the gap is filled with the liquid crystal 105, such an opened part is sealed with a sealing member 106.

Incidentally, the sampling circuit 140 and the data line driving circuit 130 are formed on the opposing surface of the device substrate 101 and along the outer sides of the sealing material 104, so that the data line driving circuit 130 drives the data lines 114 extending in the Y-direction. Further, a plurality of connecting electrodes 107 are formed on one of the sides and receive various kinds of signals inputted from the timing generator 200 and the image signal processing circuit 300. Two scanning line driving circuits 150 are formed on the two sides adjoining this side and drive the scanning line 112 extending in the X-direction from both sides. Incidentally, when the delay of the scanning signal supplied to the scanning line presents no problems, the scanning line driving circuit 150 may be formed only on one of the adjoining sides. Additionally, to reduce an image-signal writing load to be exerted onto the data line 114, a precharging circuit for precharging each of the data lines 114 to a predetermined voltage with timing preceding the writing of the image signal may be formed on the device substrate 101.

On the other hand, the common electrode 108 of the opposing substrate 102 is electrically conducted to the device substrate 101 by a conducting member provided on at least one of four corners at which the substrates are bonded. Additionally, the following components may be provided on the opposing substrate 102 according to the use of the liquid crystal panel 100. For instance, first, a stripe-like, mosaic-like or triangle-like color filter is provided on the opposing substrate 102. Second, for instance, a black matrix made of a metallic material, such as chrome or nickel, or a resin black matrix made of a material obtained by dispersing carbon or titanium particles into a photoresist is provided on the substrate 102. Third, a back light device for irradiating light onto the liquid crystal panel 100 is provided on the substrate 102. Especially, in the case of using the liquid crystal panel 100 for color-light modulation, a black matrix is provided on the opposing substrate 102 without providing a color filter thereon.

Additionally, an alignment layer rubbed in a predetermined direction is provided on the opposing surface of each of the device substrate 101 and the opposing substrate 102. On the other hand, a polarizer (not shown) corresponding to an alignment direction is provided on the back side thereof. Incidentally, when polymer dispersed liquid crystal obtained by dispersing microdroplets of liquid crystal in a polymer is used as the liquid crystal 105, the aforementioned alignment film and polarizer are unnecessary. This results in increase in light utilization efficiency, and thus advantageous in realizing a high-luminance and low-power-consumption panel.

Incidentally, instead of forming part or all of the peripheral circuit of the driving circuit 120 on the device substrate 101, a driving IC chip mounted on film may be electrically and mechanically connected to the device substrate 101 through an anisotropic conductive film provided at a predetermined place thereon by using, for example, TAB (Tape Automated Bonding) technique. Alternatively, the driving IC chip itself may be electrically and mechanically connected to a predetermined place on the device substrate 101 through an anisotropic conductive film by using COG (Chip On Grass) technique.

Method of Producing Liquid Crystal Display Device

Further, the liquid crystal display device is produced by performing the following first to fourth steps.

At a first step, the liquid crystal panel 100 is manufactured. The liquid crystal panel 100 is manufactured by bonding the device substrate 101 and the opposing substrate 102 by using the sealing material, into which the spacers 103 are mixed, after the scanning lines 112, the data lines 114, and the TFTs 116 are formed on the device substrate 101 made of glass and semiconductor material by performing a known semiconductor process. Incidentally, the data line driving circuit 130 and the scanning line driving circuit 150 are formed on the device substrate 101 together with an image display area.

At a second step, the threshold voltages Vtp and Vtn of the P-channel TFT and the N-channel TFT of the shift register 1550 of the data line driving circuit 130 and the scanning line driving circuit 150 are measured. Incidentally, the threshold Voltage Vtp of the P-channel TFT is given as the absolute value of the source-gate voltage. When the potential difference between the source and the gate thereof exceeds this absolute value of the source-gate voltage, this TFT is turned on. Conversely, when the potential difference therebetween is lower than this absolute value of the source-gate voltage, this TFT is turned off.

At the second step, the threshold voltages Vtp and Vtn are measured by using the TFTs TEG1 and TEG2 illustrated in FIG. 4. For example, when the threshold voltage Vtn of the N-channel TFT is measured, the probes of the measuring device are pressed against the terminals Tn1 to Tn3. Then, electric current is supplied through the terminal Tn1. The drain of the TFT TEG1 is grounded through the terminal Tn3. A voltage is applied to the gate of the TFT TEG1 though the terminal Tn2. Further, during the (gate) voltage at the terminal Tn2 is varied, the current value of electric current, which is flown into the terminal Tn1, and the (source) voltage at the terminal Tn1 are measured. Thus, the drain current characteristic of the N-channel TFT is measured. Then, the threshold voltage Vtn is obtained from a result of the measurement of the drain current characteristic.

At a third step, the phase of the inverted clock signal DYINV with respect to that of the clock signal DY and the phase of the inverted clock signal DXINV with respect to that of the clock signal DX are adjusted according to the threshold voltages Vtp and Vtn of the P-channel TFT and the N-channel TFT, which are obtained at the second step. At that time, the turning on and off of a DIP switch 2044 of each of a first clock signal generating circuit 200A and a second clock signal generating circuit 200B is set according to the measured threshold voltages Vtp and Vtn. Incidentally, the relation among the threshold voltages Vtp and Vtn and the clock signals DXINV and DYINV will be described later.

At a fourth step, a liquid crystal display device is completed by connecting outer circuits, such as the timing generator 200 and the image signal processing circuit 300, to the liquid crystal panel 100.

Meanwhile, the liquid crystal panels 100 are produced in lots of a certain unit number of panels. Among the liquid crystal panels of one lot, usually, the threshold voltages of the N-channel TFTs and the P-channel TFTs are nearly equal to each other. Therefore, at the second step, it is unnecessary to measure the threshold voltages of the individual liquid crystal panels 100. It is sufficient that the measurement of the threshold voltage is performed on several liquid crystal panels 100 extracted from those of one lot, and that subsequently, the third step is performed according to a result of such measurement.

Adjustment at Third Step

Next, the adjusting method at the third step is described in detail hereinbelow. Incidentally, in the following description, it is assumed that there is no difference in phase between the clock signal CLY and the inverted clock signal CLYINV.

In the Case That Threshold Voltage of P-channel TFT is Low

First, the case, in which the threshold voltage of the P-channel TFT is low, is discussed hereinbelow. In the process of manufacturing TFTs, there is a tendency that when the threshold voltage of the P-channel TFT is lowered, the threshold voltage of the N-channel TFT rises. Thus, in the case of this example, it is now considered that the threshold voltage Vtp of the P-channel TFT is lower than the design target value by $\Delta Vp$, and that the threshold voltage Vtn of the N-channel TFT is higher than the design target value by $\Delta Vn$.

FIG. 10 is a timing chart illustrating the case that the threshold voltage Vtp of the P-channel TFT is lower than the design target value by $\Delta Vp$. FIG. 11 is a circuit diagram of a unit circuit of the shift register 1550. Incidentally, in FIG. 10, reference character Vtpr designates a first reference voltage whose value is a design target value of the threshold voltage Vtp of the P-channel TFT. Further, reference character Vtnr designates a second reference voltage whose value is a design target value of the threshold voltage Vtn of the N-channel TFT.

As shown in FIG. 11, in the unit circuit R1, the inverted clock signal CLYINV is supplied to the P-channel TFT P1. Thus, the TFT P1 repeats turning-on and turning-off operations, as illustrated in FIG. 10. On the other hand, in the unit circuit R2, the clock signal CLY is supplied to the TFT P1'. Thus, the TFT P1' repeats turning-on and turning-off operations, as illustrated in FIG. 10. Therefore, in a period between a time t3 and another time t4, the TFTs P1 and P1' are simultaneously put into an ON-state. Furthermore, in the unit circuit R1, the clock signal CLY is supplied to the N-channel TFT N1. Further, in the unit circuit R2, the inverted clock signal CLYINV is supplied to the N-channel TFT N1'. Therefore, as illustrated in FIG. 10, in a period between a time t1 and another time t2, the TFTs N1 and N1' are simultaneously put into an ON-state. Incidentally, the TFTs N2 and P1 of each of the odd-numbered unit circuits operate similarly as the TFTs N2 and P1 of the unit circuit R1. The TFTs N2' and P1' of each of the odd-numbered unit circuits operate similarly as the TFTs N2' and P1' of the unit circuit R2.

Now, output signals A, B, and C of the unit circuits R1, R2, and R3 are studied.

In the case that the voltage level of the inverted clock signal CLYINV is lower than the voltage (Vdd–Vtp) at the time t3, the state of the TFT P1 of the unit R1 changes from an OFF-state to an ON-state. Then, the output signal of the inverter 1552 changes the L level to the H level. When the inverter 1554 inverts the H level of the output signal, an trailing edge Ead of the output signal A is generated.

Then, the leading edge Ebu of the output signal B of the second stage is caused by the change of the state of the TFT N2' from an OFF-state to an ON-state during the output signal A is at the H level, that is, during the TFT P2' is in the OFF-state and the TFT N1' is in an ON-state. Practically, when the TFT N2' is brought into the ON-state, the signal level of the output signal of the inverter 1552 changes from the H level to the L level. The inverter 1554 inverts this L level of the output signal of the inverter 1552. Thus, a leading edge Ebu of the output signal B is generated. The turning-on and turning-off of the TFT N2' are controlled according to the inverted clock signal CLYINV, so that the leading edge Ebu of the output signal B is synchronized with the inverted clock signal CLYINV, as illustrated in FIG. 10.

Subsequently, at the time t3, the trailing edge Ead of the output signal A is generated. However, the TFT P1' of the unit circuit R2 is in the ON-state in a period between the times t3 and t4. Thus, in response to the trailing edge Ead of the output signal A, the state of the TFT P2' changes from the OFF-state to an ON-sate. Moreover, when the TFT N1' changes from the ON-state to an OFF-state, the signal level of an output signal of the inverter 1552 changes from the H level to an L level in synchronization with the trailing edge Ead of the output signal A. The output signal B is obtained by inverting an output signal of the inverter 1552. The trailing edge Ebd of the output signal B is generated in synchronization with the trailing edge Ead of the output signal A.

However, normally, as illustrated in FIG. 7, the trailing edge Ebd of output signal B is generated after the H level thereof is maintained during only one period of the clock signal CLY. Nevertheless, the presence of a period, during which both the TFT P1 of the unit circuit R1 and the TFT P1' of the unit circuit R2 are simultaneously in the ON-state, results in the faster generation of the trailing edge Ebd of the output signal B.

Subsequently, in the unit circuit R3 of the third stage, the TFT N2 is in the ON-state during a period between the times t1 and t2 shown in FIG. 14. Thus, when the output signal B rises and the TFT N1 changes the state thereof from the OFF-state to an ON-state, the signal level of the output signal of the inverter 1552 changes from an H level to an L level. This output signal is inverted by the inverter 1554. Consequently, the leading edge Ecu of the output signal C is generated. As illustrated in FIG. 7, fundamentally, the leading edge Ecu of the output signal C generates in synchronization with the trailing edge Ead of the output signal A. However, in this example, the leading edge Ecu of the output signal C is generated in synchronization with the leading edge Ebu of the output signal B. This is owing to the fact that because the threshold voltage Vtn of the N-channel TFT is lower than the second reference voltage Vtnr by ΔVn, the TFTs N2 and N2' are simultaneously in the ON-state in a period between the times t1 and t2.

Thus, at the aforementioned third step, the following two kinds of adjustment are performed.

First adjustment is to delay the phase of the trailing edge of the inverted clock signal CLYINV. Practically, first, an amount, by which the threshold voltage Vtp of the P-channel TFT determined through the second step described above is lower than the first reference voltage Vtpr, is determined. That is, a delay time, by which the trailing edge of the inverted clock signal CLYINV is delayed, is determined according to the amount ƒ¢Vp. Then, according to the determined delay time, the setting of the DIP switch 2043 of the trailing edge control circuit 204 illustrated in FIG. 2 is adjusted. In short, a delay time, by which the trailing edge of the inverted clock signal CLYINV is delayed, is determined in such a manner as to prevent the TFT P1 of the odd-numbered unit circuit and the TFT P1' of the even-numbered unit circuit from being simultaneously put into an ON-state.

FIG. 12 is a timing chart illustrating a result of this adjustment performed so as to delay the trailing edge of the inverted clock signal CLYINV by the delay time determined in this way. In this case, the time t3 coincides with the time t4. At the time t4, the TFT P1' of the unit circuit R2 is put into an ON-state. Thus, the unit circuit R2 does not take in the trailing edge Ead of the output signal A, which is generated after the time t3 (=t4). Consequently, at the time t4, the output signal B maintains the signal level at the H level.

Second adjustment is to delay the phase of the leading edge of the inverted clock signal CLYINV. Practically, an amount, by which the threshold voltage Vtn of the N-channel TFT determined at the aforementioned second step is lower than the second reference voltage Vtnr, is determined. That is, a delay time, by which the leading edge of the inverted clock signal CLYINV is delayed, is determined according to the amount Vn. Then, according to the determined delay time, the setting of the DIP switch (corresponding to the switch 2043) of the leading edge control circuit 205 illustrated in FIG. 2 is adjusted.

In the case that a period between the times t1 and t2 illustrated in FIG. 10 is equal to the delay time td of each of the delay circuits (corresponding to those 2041a to 2041g), the DIP switch is adjusted so that data "011" can be inputted to a selection circuit (corresponding to the circuit 2042) of the leading edge control circuit 205 shown in FIG. 2. FIG. 13 is a timing chart illustrating the case that the shift register operates according to the adjusted and inverted clock signal CLYINV and the adjusted clock signal CLY. As illustrated in this figure, the adjusted trailing edge of the inverted clock signal CLYINV is delayed by the time td from the leading edge of the clock signal CLY. Thus, as illustrated in FIG. 13, the time t1 coincides with the time t2, so that the TFTsN2 and N2' are not simultaneously turned on. This prevents the leading edge Ecu of the output signal C from being generated in synchronization with the leading edge Ebu of the output signal B.

In the Case That Threshold Voltage of N-channel TFT is Low

Next, the case, in which the threshold voltage of the N-channel TFT is low, is discussed hereinbelow. In contrast to the previously described case, in the process of manufacturing TFTs, there is a tendency that when the threshold voltage of the N-channel TFT is lowered, the threshold voltage of the P-channel TFT rises. Thus, in the case of this example, it is now considered that the threshold voltage Vtn of the N-channel TFT is lower than the design target value by ΔVn, and that the threshold voltage Vtp of the P-channel TFT is higher than the design target value by ΔVp.

FIG. 14 is a timing chart illustrating the case that the threshold voltage Vtn of the N-channel TFT is lower than the design target value by ΔVn. As illustrated in FIG. 11, the clock signal CLY is supplied to the TFT N2 in the unit circuit R1. Thus, the TFT N2 repeats turning-on and turning-off operations, as illustrated in FIG. 14. On the other hand, in the unit circuit R2, the inverted clock signal CLYINV is supplied to the TFT N2'. Thus, the TFT N2' repeats turning-on and turning-off operations, as illustrated in FIG. 14. Therefore, in a period between a time t1 and another time t2, the TFTs N2 and N2' are simultaneously put into an ON-state. Furthermore, in the unit circuit R1, the inverted clock signal CLYINV is supplied to the P-channel TFT P1.

Further, in the unit circuit R2, the clock signal CLY is supplied to the P-channel TFT P1'. Therefore, as illustrated in FIG. 14, in the period between the times t3 and t4, the TFTs P1 and P1' are simultaneously put into an ON-state.

Now, the output signals A, B, and C of the unit circuits R1, R2, and R3 are further studied.

In the case that the voltage level of the inverted clock signal CLYINV is lower than the voltage (Vdd–Vtp) at the time t3, the state of the TFT P1 of the unit R1 changes from an OFF-state to an ON-state. Then, the output signal of the inverter 1552 changes from the L level to the H level. When the inverter 1554 inverts the H level of the output signal, an trailing edge Ead of the output signal A is generated.

Then, the leading edge Ebu of the output signal B of the second stage is caused by the change of the state of the TFT N2' from an OFF-state to an ON-state during the output signal A is at the H level, that is, during the TFT P2' is in an OFF-state and the TFT N1' is in an ON-state. Practically, when the TFT N2' is brought into an ON-state, the signal level of the output signal of the inverter 1552 changes from the H level to the L level. The inverter 1554 inverts this L level of the output signal of the inverter 1552. Thus, a leading edge Ebu of the output signal B is generated. The turning-on and turning-off of the TFT N2' are controlled according to the inverted clock signal CLYINV, so that the leading edge Ebu of the output signal B is synchronized with the inverted clock signal CLYINV, as illustrated in FIG. 14.

Subsequently, at the time t3, the trailing edge Ead of the output signal A is generated. At that time, the TFT P1' of the unit R2 is in the ON-state. Thus, in response to the trailing edge Ead of the output signal A, the state of the TFT P2' changes from the OFF-state to an ON-state. Moreover, when the TFT N1' changes from the ON-state to an OFF-state, the signal level of an output signal of the inverter 1552 changes from the H level to an L level in synchronization with the trailing edge Ead of the output signal A. The output signal B is obtained by inverting an output signal of the inverter 1552. The trailing edge Ebd of the output signal B is generated in synchronization with the trailing edge Ead of the output signal A.

However, normally, as illustrated in FIG. 7, the trailing edge Ebd of the output signal B is generated after the H level thereof is maintained during only one period of the clock signal CLY. Nevertheless, the presence of a period, during which both the TFT P1 of the unit circuit R1 and the TFT P1' of the unit circuit R2 are simultaneously in the ON-state, results in the faster generation of the trailing edge Ebd of the output signal B.

Subsequently, in the unit circuit R3 of the third stage, the TFT N2 is in the ON-state during a period between the times t1 and t2 shown in FIG. 14. Thus, when the output signal B rises and the TFT N1 changes the state thereof from the OFF-state to an ON-state, the signal level of the output signal of the inverter 1552 changes from the H level to the L level. This output signal is inverted by the inverter 1554. Consequently, the leading edge Ecu of the output signal C is generated. As illustrated in FIG. 7, fundamentally, the leading edge Ecu of the output signal C generates in synchronization with the trailing edge Ead of the output signal A. However, in this example, the leading edge Ecu of the output signal C is generated in synchronization with the leading edge Ebu of the output signal B. This is owing to the fact that because the threshold voltage Vtn of the N-channel TFT is lower than the second reference voltage Vtnr by ΔVn, the TFTs N2 and N2' are simultaneously in the ON-state in a period between the times t1 and t2.

Thus, at the aforementioned third step, the following two kinds of adjustment are performed. First adjustment is to delay the phase of the leading edge of the inverted clock signal CLYINV. Practically, an amount, by which the threshold voltage Vtn of the N-channel TFT measured at the second step is lower than the second reference voltage Vtnr, is determined. That is, a delay time, by which the leading edge of the inverted clock signal CLYINV is delayed, is determined according to the amount ΔVn. Then, according to the determined delay time, the setting of the DIP switch (corresponding to the switch 2043) of the leading edge control circuit 205 illustrated in FIG. 2 is adjusted.

In the case that a period between the times t1 and t2 illustrated in FIG. 14 is equal to the delay time td of each of the delay circuits (corresponding to those 2041a to 2041g) of the trailing edge control circuit 204 shown in FIG. 2, the DIP switch is adjusted so that data "011" can be inputted to a selection circuit (corresponding to the circuit 2042) of the leading edge control circuit 205. FIG. 15 is a timing chart illustrating the case that the shift register operates according to the adjusted inverted clock signal CLYINV and the clock signal CLY. As illustrated in this figure, the adjusted trailing edge of the inverted clock signal CLYINV is delayed by the time td from the leading edge of the clock signal CLY. Thus, in the period between the times t1 and t2 illustrated in FIG. 14, the TFTs N2 and N2' are not simultaneously turned on. This prevents the leading edge Ecu of the output signal C from being generated in synchronization with the leading edge Ebu of the output signal B.

Second adjustment is to delay the phase of the trailing edge of the inverted clock signal CLYINV. Practically, an amount, by which the threshold voltage Vtp of the P-channel TFT determined at the aforementioned second step is lower than the first reference voltage Vtpr, is determined. That is, a delay time, by which the trailing edge of the inverted clock signal CLYINV is delayed, is determined according to the amount ƒ¢Vp. Then, according to the determined delay time, the setting of the DIP switch 2043 of the trailing edge control circuit 204 illustrated in FIG. 2 is adjusted. In short, a delay time, by which the trailing edge of the inverted clock signal CLYINV is delayed, is determined in such a manner as to prevent the TFT P1 of the odd-numbered unit circuit and the TFT P1' of the even-numbered unit circuit from being simultaneously put into an ON-state.

FIG. 16 is a timing chart illustrating a result of this adjustment performed so as to delay the trailing edge of the inverted clock signal CLYINV by the delay time determined in this way. In this case, the time t3 coincides with the time t4. At the time t4, the TFT P1' of the unit circuit R2 is put into an OFF-state. Thus, the unit circuit R2 does not take in the trailing edge Ead of the output signal A, which is generated after the time t3 (=t4). Consequently, at the time t4, the output signal B maintains the signal level at the H level. The trailing edge Ebd thereof is prevented from being generated in synchronization with the trailing edge Eab of the output signal C.

Thus, at the third step, the phase of the trailing edge of the inverted clock signal CLYINV is adjusted according to the threshold voltage Vtn of the N-channel TFT. Consequently, in the unit circuits R1 to Rn, the TFTs N1 and N1' are prevented from being simultaneously put into an ON-state. This enables both output signals of the unit circuits R1 to Rn to normally rise.

Moreover, at the third step, the phase of the trailing edge of the inverted clock signal CLYINV is adjusted according to the threshold voltage Vtp of the P-channel TFT. Consequently, in the unit circuits R1 to Rn, the TFTs P1 and P1' are prevented from being simultaneously put into an ON-state. This enables both output signals of the unit circuits R1 to Rn to normally fall.

As a result, even when the threshold voltages of the P-channel TFT and the N-channel TFT of the shift register are deviated from the design target values, the shift register can be normally operated. Consequently, even a display panel, which has hitherto been treated as a defective due to malfunction of the shift register, can be treated as a quality item. Therefore, the yield of the display panel can be considerably enhanced.

EXAMPLES OF APPLICATION

Consideration of ON-current

In the aforementioned method of producing liquid crystal display devices, at the second step, the threshold voltage Vtp of the P-channel TFT and the threshold voltage Vtn of the N-channel TFT are measured. Then, at the third step, the phases of the trailing edge and the leading edge of the inverted clock signal CLYINV are individually adjusted. Thus, this method is to adjust the phase of the inverted clock signal CLYINV, which is supplied to the gate, according to the threshold voltage to thereby normally operate the shift register, owing to the fact that the timing, with which both the TFTs (N2 and N2') or (P1 and P2) of each of the unit circuits R1 to Rn are simultaneously turned on, is determined according to the threshold voltages of the TFTs.

Meanwhile, even when the TFTs (N2, N2') or (P1, P1') are simultaneously turned on, in the case that the period, during which the TFTs are in the ON-state, is short, the signal may not completely rise from the L level to the H level, or the signal may not completely fall from the H level to the L level. In such a case, an extremely narrow pulse of a small amplitude is superposed on an output signal of each of the unit circuits R1 to Rn. However, this pulse has a small amplitude and thus cannot bring the P-channel TFT and the N-channel TFT of the next state into an ON-state. Thus, there are practically no problems. Therefore, no malfunction occurs in the case that the period, during which both the TFTs are in the ON-state, is appropriately short.

However, in the case of allowing the presence of the period, during which both the TFTs are in the ON-state, it is necessary for the following reason to take the slew rate of the signal into account. That is, when the slew rate is high, the logical level of the signal changes between the H level and the L level in a short time. Thus, in the case that the logical level of the signal completely changes within the allowed period, the shift register malfunctions.

Incidentally, the slew rate of the signal is determined according to the ON-current of the P-channel TFT and the ON-current of the N-channel TFT. That is, the larger the ON-current, the higher the slew rate.

Thus, at the second step, in addition to the threshold voltages Vtp and Vtn, the ON-current "ip" of the P-channel TFT and the ON-current "in" of the N-channel TFT may be measured. Moreover, at the third step, the phase of the inverted clock signal CLYINV may be adjusted according to results of the measurement.

Incidentally, the ON-current "ip" of the P-channel TFT is defined as a drain current in the case that the P-channel TFT is biased by a power supply voltage. The ON-current "in" of the N-channel TFT is defined as a drain current in the case that the N-channel TFT is biased by a power supply voltage. For example, when the power supply voltage is 5V, the ON-current "ip" is a drain current when the gate voltage Vg=−5V. Further, the ON-current "in" is a drain current when the gate voltage Vg=5V.

In this case, the phase of the trailing edge of the inverted clock signal CLYINV and the phase of the leading edge of the clock signal CLY are relatively adjusted according to the threshold voltage Vtp and the ON-current "ip" (that is, the DIP switch 2043 of the trailing edge control circuit 204 is set), while the phase of the leading edge of the inverted clock signal CLYINV and the phase of the trailing edge of the clock signal CLY are relatively adjusted according to the threshold voltage Vtn and the ON-current "in" (that is, the DIP switch of the leading edge control circuit 205 is set).

Qualitatively, the larger the ON-currents "ip" and "in", the higher the slew rate. Thus, it is necessary to increase what is called a phase adjusting amount. Thus, the phases are adjusted so that as the ON-current "ip" increases, the delay amount, by which the phase of the trailing edge of the inverted clock signal CLYINV is delayed from the phase of the leading edge of the clock signal CLY, is increased, and so that as the ON-current "in" increases, the delay amount, by which the phase of the leading edge of the inverted clock signal CLYINV is delayed from the phase of the trailing edge of the clock signal CLY, is increased.

More concretely, the setting of the DIP switch 2043 of the trailing edge control circuit 204 is performed as follows. First, in the case that the threshold voltage Vtp is within a predetermined range, and that the ON-current "ip" is equal to or less than the first reference current ipr, the setting condition of the DIP switch 2043 remains the same as the initial setting condition thereof. This is because of the facts that the period, during which the TFTs are simultaneously turned on, is short, that the slew rate of the signal is low, and that the adjustment is unnecessary. In other words, the predetermined range of the threshold voltage Vtp and the first reference current ipr are determined in such a way as to prevent an occurrence of malfunction.

Second, in the case that the threshold voltage Vtp is outside the predetermined range, the delay time, by which the trailing edge of the inverted clock signal CLYINV is delayed, is determined according to the difference voltage ΔVp between the threshold voltage Vtp and the first reference voltage Vtpr. Then, the DIP switch 2043 is set in such way as to obtain such a delay time.

Third, in the case that the threshold voltage Vtp is within the predetermined range, and that the ON-current "ip" is equal to or less than the first reference current ipr, the delay time, by which the trailing edge of the inverted clock signal CLYINV is delayed, is determined according to the difference current between the ON-current "ip" and the first reference current ipr. Then, the DIP switch 2043 is set in such way as to obtain such a delay time.

Furthermore, the setting of the DIP switch of the leading edge control circuit 205 is performed, similarly as the setting of the trailing edge control circuit 204.

Adjustment of Phase of Clock Signal

At the aforementioned third step, the phase of the leading edge of the inverted clock signal CLYINV is adjusted according to the threshold voltage Vtn of the N-channel TFT, with the intention of preventing the TFTs N2 and N2' from being simultaneously in the ON-state in each of the unit circuits R1 to Rn. Meanwhile, the TFT N2' is controlled by the inverted clock signal CLYINV. On the other hand, the TFT N2 is controlled by the clock signal CLY. Therefore, instead of delaying the phase of the leading edge of the inverted clock signal CLYINV, the phase of the trailing edge of the clock signal CLY may be controlled in such a way as to be advanced. In short, it is sufficient to adjust the relative phases of the leading edge of the inverted clock signal CLYINV and of the trailing edge of the clock signal CLY according to the threshold voltage Vtn (or according to the threshold voltage Vtn and the ON-current "in") of the N-channel TFT in such a manner as to prevent the TFTs N2 and N2' from being simultaneously brought into the ON-state.

Further, at the aforementioned third step, the phase of the trailing edge of the inverted clock signal CLYINV is adjusted according to the threshold voltage Vtp of the P-channel TFT, with the intention of preventing the TFTs P1 and P1' from being simultaneously put into the ON-state in each of the unit circuits R1 to Rn. Meanwhile, the TFT P1' is controlled by the inverted clock signal CLYINV. On the other hand, the TFT P1 is controlled by the clock signal CLY. Therefore, instead of delaying the phase of the trailing edge of the inverted clock signal CLYINV, the phase of the leading edge of the clock signal CLY may be controlled in such a way as to be advanced. In short, it is sufficient to adjust the relative phases of the trailing edge of the inverted clock signal CLYINV and of the leading edge of the clock signal CLY according to the threshold voltage Vtp (or according to the threshold voltage Vtp and the ON-current "ip") of the P-channel TFT in such a manner as to prevent the TFTs P1 and P1' from being simultaneously brought into the ON-state.

Feedback of Threshold Voltage

In the aforementioned liquid crystal display device, the relative phases of the clock signal CLY and the inverted clock signal CLYINV are adjusted by setting the DIP switch according to the threshold voltages Vtp and Vtn. However, the liquid crystal display device may be adapted so that the threshold voltages Vtp and Vtn are fed back to the timing generator 200, and that the relative phases of both the clock signals are automatically adjusted according to the threshold voltages Vtp and Vtn. Hereinafter, the improvement of the first clock signal generating circuit 200A for generating the clock signal CLY and the inverted clock signal CLYINV supplied to the shift register of the scanning line driving circuit 150 is described. Needless to say, the second clock signal generating circuit 200B may be similarly constituted.

FIG. 17 is a schematic illustrating a primary portion of the first clock signal generating circuit 200A' for automatically adjusting the relative phase of the clock signal, and the peripheral circuit thereof.

As shown in this figure, a first threshold voltage detecting portion 210 and a second threshold voltage detecting portion 220 are provided in each shift register, and produced in the same manufacturing process as that for producing TFTs of the shift registers. The first threshold voltage detecting portion 210 is used for detecting the threshold voltages Vtp of the P-channel TFTs, and configured by series-connecting a bias resistor 211 and P-channel TFTs 212 to 214 between the positive power supply Vdd and the negative power supply Vss. Incidentally, in the case of each of the P-channel TFTs 212 to 214, the source terminal and the gate terminal are short-circuited. Thus, the potential difference between a connecting point X1 and the positive power source Vdd is indicated as being 3Vtp. Therefore, the threshold voltage Vtp of the P-channel TFT can be known according to the voltage at the connecting point X1. Thus, the first threshold voltage detecting portion 210 outputs the voltage at the connecting point X1 as a first detection voltage Vdp to the timing generator 200.

On the other hand, the second threshold voltage detecting portion 220 is used for detecting the threshold voltages Vtn of the N-channel TFTs, and configured by series-connecting N-channel TFTs 222 to 224 and a bias resistor 221 between the positive power supply Vdd and the negative power supply Vss. Similarly as the first threshold voltage detecting portion 210, the second threshold voltage detecting portion 220 outputs the voltage at a connecting point X2 as a second detection voltage Vdn to the timing generator 200. Incidentally, the reason for series-connecting three TFTs in each of the first threshold voltage detecting portion 210 and the second threshold voltage detecting portion 220 is that the detecting accuracy is enhanced and the threshold voltages of the three TFTs are averaged by tripling a change amount of each of the threshold voltages Vtp and Vtn and then detecting the tripled change amount.

Further, a first selection control signal generating portion 207 is operative to generate a first selection control signal CTL1, which is used for controlling a selection circuit 2042, according to the first detection voltage Vdp. On the other hand, a second selection control signal generating portion 208 is operative to generate a second selection control signal, which is used for controlling the selection circuit, according to the second detection voltage Vdp.

When the first detection voltage Vdp and the second detection voltage Vdn are detected in the first threshold voltage detecting portion 210 and the second threshold voltage detecting portion 220, respectively, these detection voltages are fed back to the first clock signal generating circuit 200A. According to these detection voltages, the first selection control signal CTL1 and the second selection control signal CTL2 are generated. In other words, the feedback control of the phases of the trailing edge and the leading edge of the inverted clock signal CLYINV is performed according to the threshold voltages Vtp and Vtn.

This can eliminate the need for the measurement of the threshold voltages, which is performed at the second step, and the setting of the DIP switch, which is performed at the third step. Consequently, the process of producing the liquid crystal display device can be simplified by simultaneously increasing the yield of the liquid crystal panel 100.

Further, each of the threshold voltage Vtp and Vtn has temperature characteristics. However, in the device of the aforementioned configuration, the feedback control thereof is performed. Thus, even when the threshold voltages Vtp and Vtn change as the temperature varies, the phase of the inverted clock signal CLYINV is automatically controlled in such a manner as to follow the change in the threshold voltage. Therefore, even in the environment where a wide temperature change occurs, the shift register can be normally operated.

Moreover, FIG. 18 is a schematic illustrating a modification of the first clock signal generating circuit 200A' illustrated in FIG. 17. The configuration of the modification shown in FIG. 18 is similar to that of the circuit shown in FIG. 17 except that a first ON-current detecting portion 230 for detecting ON-current "ip" and a second ON-current detecting portion 240 for detecting ON-current "in" are added to the circuit of FIG. 17.

Incidentally, each of the first ON-current detecting portion 230 and the second ON-current detecting portion 240 is provided in the shift register, similarly as the first threshold voltage detecting portion 210 and the second threshold voltage detecting portion 220. Furthermore, each of the first ON-current detecting portion 230 and the second ON-current detecting portion 240 is produced in the same manufacturing process as that for producing the TFTs of the shift register.

In this example, a signal ip' indicating the ON-current "ip" of the P-channel TFT is obtained by the first ON-current detecting portion 230. On the other hand, a signal in' indicating the ON-current "in" of the N-channel TFT is obtained by the second ON-current detecting portion 240. Further, the first selection control signal generating circuit 207 performs the feedback control of the phase of the trailing edge of the inverted clock signal CLYINV according to the signal ip' and the first detection voltage Vdp.

Furthermore, the second selection control signal generating circuit 208 performs the feedback control of the phase of the leading edge of the inverted clock signal CLYINV according to the signal in' and the second detection voltage Vdn.

Consequently, even when the threshold voltage and ON-current of the TFT are largely deviated from the design target values, the shift register can be prevented from malfunctioning.

Configuration of Device Substrate

Further, in the foregoing description of the embodiment, it has been described that the device substrate 101 of the liquid crystal panel 100 is constituted by a transparent insulative substrate made of glass, that silicon thin film is formed on this substrate, and that the switching device (the TFT 116) for each pixel and the constituent devices of the driving circuit 120 are constituted by TFTs, each of which has a source, a drain and channels formed on the thin film. However, the present invention is not limited thereto.

For example, the device substrate 101 may be constituted by a semiconductor substrate. Moreover, each of the switching devices of the pixels, and the devices of the driving circuit 120 may be constituted by an insulating gate field effect transistor that is obtained by forming a source, a drain and channels on the surface of the semiconductor substrate. In the case that the device substrate 101 is constituted by a semiconductor substrate in this manner, a liquid crystal panel using such a device substrate cannot be used as a transparent display panel. Thus, the pixel electrodes 118 are made of, for instance, aluminum. Consequently, the liquid crystal panel is used as that of the reflection type. Further, the device substrate 101 may be constituted simply by a transparent substrate. Moreover, the pixel electrodes 118 may be of the reflection type.

Moreover, in the foregoing description of the embodiment, it has been described that the switching device at each pixel is a three-terminal device typified by a TFT. The switching device may be constituted by a two- terminal device, such as a diode. Incidentally, in the case of using a two- terminal device as the switching device, it is necessary that the scanning line 112 is formed on one of the substrates, while the data line 114 is formed on the other substrate, and that the two-terminal device is formed between a pixel electrode and one of the scanning line 112 and the data line 114. In this case, each pixel includes the two- terminal device and the liquid crystal layer, which are series-connected between the scanning line 112 and the data line 114.

Further, although the active matrix liquid crystal panels using TFTs have been described by way of example, the present invention is not limited to thereto. The present invention can be applied to a passive liquid crystal display device using STN (Super Twisted Nematic) liquid crystal. Moreover, the present invention can be applied to display devices adapted to display an image by using electroluminescence devices as the electro-optical material other than liquid crystal, and utilizing various kinds of electro-optical effects. That is, the present invention can be applied to electro-optical devices each having a constitution similar to that of the aforementioned liquid crystal display device.

Electronic Equipment

Next, examples of applying the aforementioned liquid crystal panel to electronic equipment are described hereinbelow.

First Example

Projector

First, a projector, in which this liquid crystal panel is used as a light valve, is described hereunder. FIG. 19 is a plan diagram illustrating the configuration of an example of a projector.

As illustrated in this figure, a lamp unit 1102 constituted by a white-light source, such as a halogen lamp, is provided in a projector 1100. Projection light emitted from this lamp unit 1102 is separated into three primaries, namely, R, G, B light rays by four mirrors 1106 and two dichroic mirrors 1108, which are placed in a light guide 1104. Then, the separated light rays are incident upon liquid crystal panels 1110R, 1110b, and 1110G serving as light valves respectively corresponding to the primaries.

Each of the liquid crystal panels 1110R, 1110B, and 1110G has the same constitution as that of the aforementioned liquid crystal panel 100. Further, the liquid crystal panels 1110R, 1110B, and 1110G are driven by R, G, B primary signals supplied from an image signal processing circuit (not shown), respectively. The light rays modulated by these liquid crystal panels are incident upon a dichroic prism 1112 from three directions. This dichroic prism 1112 deflects the R and B light rays by 90 degrees. On the other hand, the G light ray rectilinearly travels. Therefore, a color image is synthesized from respective color component images, so that the color image is projected onto a screen through a projection lens 1114.

Incidentally, focusing attention on images displayed by the liquid crystal panels 1110R, 1110B, and 1110G, it is necessary to laterally inverting an image, which is displayed by the liquid crystal panel 1110G, with respect to the liquid crystal panels 1110R and 1110B.

Additionally, the light rays corresponding to the primaries R, G, B are incident upon the liquid crystal panels 1110R, 1110B, and 1110G by the dichroic mirror 1108. Thus, there is no need for providing a color filter on the opposing substrate.

Second Example

Mobile Computer

Next, an example of applying this liquid crystal panel to a mobile computer is described hereinbelow. FIG. 20 is a perspective diagram illustrating the configuration of this personal computer. As illustrated in this figure, the computer 1200 includes a main unit portion 1204, which has a keyboard 1202, and a liquid crystal display portion 1206. This liquid crystal display portion 1206 is constituted by enabling the aforementioned liquid crystal panel 100 to be back-lit.

Third Example

Hand-portable Telephone Set

Furthermore, an example of applying this liquid crystal panel 100 to a hand-portable telephone set is described hereunder. FIG. 21 is a perspective diagram illustrating the configuration of this hand-portable telephone set. As illustrated in this figure, the hand-portable telephone set 1302 has a reflective liquid crystal panel 100 in addition to a plurality of operating buttons 1302. A front light is provided in front of the reflective liquid crystal panel 100, if necessary.

Incidentally, in addition to the examples of the electronic equipment described with reference to FIGS. 19 to 21, other examples are a liquid crystal television, a view-finder type or direct-view-type camcorder, a car navigation device, a pager, an electronic notepad, an electric calculator, a word processor, a workstation, a TV phone, a POS terminal, and a device having a touch panel. Needless to say, the aforementioned liquid crystal panel of the present invention can be applied to such various kinds of electronic equipment.

As above described, according to the present invention, there can be provided a clock signal adjusting method and circuit, which can prevent shift registers from malfunctioning. There can also be provided an electro-optical device and electronic equipment, to which the clock signal adjusting method and circuit are applied. Further, when electro-optical devices are produced, the yield of the devices can be increased.

What is claimed is:

1. A method of adjusting a clock signal in an electro-optical device having a display portion, which has a plurality of scanning lines, a plurality of data lines, and pixels provided respectively corresponding to intersections between said scanning lines and said data lines, and also having a shift register that sequentially shifts a start pulse according to a clock signal and an inverted clock signal, said electro-optical device structured to generate signals, which are supplied to said plurality of scanning lines or said plurality of data lines, according to each output signal of said shift register, said method being employed to adjust phases of the clock signal and the inverted clock signal, which are supplied to said shift register, said method comprising the steps of:

detecting a threshold voltage of a transistor representative of at least one transistor of said shift register; and adjusting relative phases of the clock signal and the inverted clock signal according to the detected threshold voltage.

2. The method of adjusting a clock signal in an electro-optical device according to claim 1, wherein the step of detecting a threshold voltage of transistor representative of at least one transistor of said shift register comprises the steps of:

measuring a threshold voltage of a test transistor produced by a manufacturing process that is the same as a manufacturing process of said transistors of said shift register; and detecting the threshold voltage of said transistor representative of at least one transistor of said shift register according to a result of the measurement.

3. The method of adjusting a clock signal in an electro-optical device according to claim 1, wherein said transistors of said shift register are a P-channel TFT and an N-channel TFT, wherein the step of measuring the threshold voltage includes measuring a first threshold voltage of said P-channel TFT and a second threshold voltage of said N-channel TFT, and wherein the step of adjusting the phases of the clock signal and the inverted clock signal includes the step of adjusting the phases thereof according to the first and second threshold voltages.

4. The method of adjusting a clock signal in an electro-optical device according to claim 3, wherein the step of adjusting the phases includes the step of adjusting relative phases of a leading edge of the clock signal and a trailing edge of the inverted clock signal according to the first threshold voltage.

5. The method of adjusting a clock signal in an electro-optical device according to claim 4, wherein the step of adjusting the phases includes the step of adjusting relative phases of a trailing edge of the clock signal and a leading edge of the inverted clock signal according to the second threshold voltage.

6. The method of adjusting a clock signal in an electro-optical device according to claim 1, wherein the step of adjusting relative phases of the clock signal and the inverted clock signal comprises the steps of:

delaying pulses for generating the clock signal;

distributing the delayed pulses to a trailing edge control circuit and a leading edge control circuit;

delaying the delayed and distributed pulses step by step and generating a plurality of output signals, in each of the trailing edge control circuit and the leading edge control circuit;

selecting the output signal according to the detected threshold voltage, in each of the trailing edge control circuit and the leading edge control circuit; and adjusting the relative phases of the clock signal and the inverted clock signal according to the selected output signal.

7. A method for use in an electro-optical device having a display portion, which has a plurality of scanning lines, a plurality of data lines, and pixels provided respectively corresponding to each of intersections between said scanning lines and said data lines, and also having a shift register that sequentially shifts a start pulse according to a clock signal and an inverted clock signal, said electro-optical device structured to generate signals, which are supplied to said plurality of scanning lines or said plurality of data lines, according to each output signal of said shift register, said method being employed to adjust phases of the clock signal and the inverted clock signal, which are supplied to said shift register, said method comprising the steps of:

detecting a threshold voltage and an ON-current of a transistor representative of at least one transistor of said shift register; and adjusting relative phases of the clock signal and the inverted clock signal according to the detected threshold voltage and ON-current.

8. The method of adjusting a clock signal in an electro-optical device according to claim 7, wherein the step of detecting a threshold voltage and an ON-current of a transistor representative of at least one transistor of said shift register comprises the steps of:

measuring a threshold voltage and an ON-current of a test transistor produced by a same manufacturing process that is the same as a manufacturing process of said transistors of said shift register; and detecting the threshold voltage and ON-current of said transistor representative of at least one transistor of said shift register according to a result of the measurement.

9. The method of adjusting a clock signal in an electro-optical device according to claim 7, wherein said transistors of said shift register are a P-channel TFT and an N-channel TFT, wherein the step of measuring the threshold voltage includes measuring a first threshold voltage and a first ON-current of said P-channel TFT and a second threshold voltage and a second ON-current of said N-channel TFT, and wherein the step of adjusting the phases of the clock signal and the inverted clock signal according to the first threshold voltage and ON-current and the second threshold voltage and ON-current.

10. The method of adjusting a clock signal in an electro-optical device according to claim 9, wherein the step of adjusting the phases includes the step of adjusting relative phases of a leading edge of the clock signal and a trailing edge of the inverted clock signal according to the first threshold voltage and ON-current.

11. The method of adjusting a clock signal in an electro-optical device according to claim 7, wherein the step of adjusting the phases includes the step of adjusting phases of a trailing edge of the clock signal and a leading edge of the inverted clock signal according to the second threshold voltage and ON-current.

12. The method for use in an electro-optical device according to claim 7, wherein the step of adjusting relative phases of the clock signal and the inverted clock signal comprises the steps of:

delaying pulses for generating the clock signal;

distributing the delayed pulses to a trailing edge control circuit and a leading edge control circuit;

delaying the delayed and distributed pulses step by step and generating a plurality of output signals, in each of the trailing edge control circuit and the leading edge control circuit;

selecting the output signal according to the detected threshold voltage, in each of the trailing edge control circuit and the leading edge control circuit; and adjusting the relative phases of the clock signal and the inverted clock signal according to the selected output signal.

13. A clock signal adjusting circuit for use in an electro-optical device having a display portion, which has a plurality of scanning lines, a plurality of data lines, and pixels provided respectively corresponding to intersections between said scanning lines and said data lines, and also having a shift register that sequentially shifts a start pulse according to a clock signal and an inverted clock signal, said electro-optical device structured to generate signals, which are supplied to said plurality of scanning lines or said plurality of data lines, according to each output signal of said shift register, said clock signal adjusting circuit being used to adjust phases of the clock signal and the inverted clock signal, which are supplied to said shift register, said clock signal adjusting circuit comprising:

a first phase adjusting portion that adjusts relative phases of a leading edge of the clock signal and a trailing edge of the inverted clock signal according to a threshold voltage of a transistor representative of at least one transistor of said shift register; and a second phase adjusting portion that adjusts relative phases of a trailing edge of the clock signal and a leading edge of the inverted clock signal according to a threshold voltage of a transistor representative of at least one transistor of said shift register.

14. The clock signal adjusting circuit for use in an electro-optical device according to claim 13, which includes a P-channel TFT and an N-channel TFT as said transistors of said shift register, and which further comprises:

a first threshold voltage detecting portion that detects a first threshold voltage of said P-channel TFT; and a second threshold voltage detecting portion that detects a second threshold voltage of said N-channel TFT, wherein said first phase adjusting portion adjusts the relative phases of the leading edge of the clock signal and the trailing edge of the inverted clock signal according to the first threshold voltage, while said second phase adjusting portion adjusts the relative phases of the trailing edge of the clock signal and the leading edge of the inverted clock signal according to the second threshold voltage.

15. The clock signal adjusting circuit for use in an electro-optical device according to claim 14, wherein said shift register normally shifts a start pulse in a case that an absolute value of the first threshold voltage is equal to a first reference voltage value and that an absolute value of the second threshold voltage is equal to a second reference voltage value, and wherein said first phase adjusting portion delays the trailing edge of the inverted clock signal from the leading edge of the clock signal in a case that the absolute value of the first threshold voltage is lower than the first reference value and that the absolute value of the second threshold voltage is higher than the second reference voltage value.

16. The clock signal adjusting circuit for use in an electro-optical device according to claim 14, wherein said shift register normally shifts a start pulse in a case that an absolute value of the first threshold voltage is equal to a first reference voltage value and that an absolute value of the second threshold voltage is equal to a second reference voltage value, and wherein said first phase adjusting portion delays the trailing edge of the inverted clock signal from the leading edge of the clock signal in a case that the absolute value of the first threshold voltage is higher than the first reference value and that the absolute value of the second threshold voltage is lower than the second reference voltage value.

17. The clock signal adjusting circuit for use in an electro-optical device according to claim 14, wherein at least said first and second threshold voltage detecting portions are formed on a same substrate on which said shift register is formed, wherein said first threshold voltage detecting portion has and uses a P-channel TFT formed in a same process as a process, in which said P-channel TFT of said shift register is formed, to thereby detect the first threshold voltage, and wherein said second threshold voltage detecting portion has and uses an N-channel TFT formed in a same process as a process, in which said N-channel TFT of said shift register is formed, to thereby detect the second threshold voltage.

18. The clock signal adjusting circuit for use in an electro-optical device according to claim 14, wherein said shift register is constituted by cascade-connecting a plurality of unit circuits, wherein each of said unit circuits comprises a first inverter being supplied with an input signal of said unit circuit and a latch circuit that comprises a second inverter, which is operative to invert an output signal of said first inverter and to output a resultant signal as an output signal of said unit circuit, and a third inverter, which is operative to invert an output signal of said second inverter and to supply the inverted signal to an input terminal of said second inverter, wherein said first inverter is structured so that said first inverter has a first P-channel TFT, a second P-channel TFT, a first N-channel TFT, and a second N-channel TFT, which are serially series-connected between a first power supply and a second power supply, that an output signal of said first inverter is fetched from a connecting point between said second P-channel TFT and said first N-channel TFT, that a gate of said second P-channel TFT is connected to a gate of said first N-channel TFT, that an input signal to a corresponding one of said plurality of unit circuits is supplied to a connecting point between said second P-channel TFT and said first N-channel TFT, that a clock signal is supplied to a gate of said first P-channel TFT of each odd-numbered one of said plurality of unit circuits, that an inverted clock signal is supplied to a gate of said second N-channel TFT of each odd-numbered one of said plurality of unit circuits, and that an inverted clock signal is supplied to a gate of said first P-channel TFT of each even-numbered one of said plurality of unit circuits, that a clock signal is supplied to a gate of said second N-channel TFT of each even-numbered one of said plurality of unit circuits.

19. An electro-optical device, comprising:

a display portion having a plurality of scanning lines, a plurality of data lines, and pixels provided respectively corresponding to intersections between said plurality of scanning lines and said plurality of data lines;

a shift register that sequentially shifts a start pulse according to a clock signal and an inverted clock signal;

a driving portion that generates signals to be supplied to said plurality of scanning lines or said plurality of data lines; and the clock signal adjusting circuit according to claim 13.

20. Electronic equipment that includes the electro-optical device according to claim 19, the electro-optical device being operable as a display.

21. The clock signal adjusting circuit for use in an electro-optical device according to claim 13, wherein the clock signal adjusting circuit further comprises a delay circuit that delays pulses for generating the clock signal and a distribution circuit that distributes the delayed pulses to the first phase adjusting portion and the second phase adjusting portion, the first phase adjusting portion and the second phase adjusting portion that delay the delayed and distributed pulses step by step and generate a plurality of output signals, select the output signal according to the detected threshold voltage, and adjust relative phases of the clock signal and the inverted clock signal according to the selected output signal.

22. A clock signal adjusting circuit for use in an electro-optical device having a display portion, which has a plurality of scanning lines, a plurality of data lines, and pixels provided respectively corresponding to each of intersections between said scanning lines and said data lines, and also having a shift register that sequentially shifts a start pulse according to a clock signal and an inverted clock signal, said electro-optical device structured to generate signals, which are supplied to said plurality of scanning lines or said plurality of data lines, according to each output signal of said shift register, said clock signal adjusting circuit being used to adjust phases of the clock signal and the inverted clock signal, which are supplied to said shift register, said clock signal adjusting circuit comprising:

a first phase adjusting portion that adjusts relative phases of a leading edge of the clock signal and a trailing edge of the inverted clock signal according to a threshold voltage and an ON-current of a transistor representative of at least one transistor of said shift register; and a second phase adjusting portion that adjusts relative phases of a trailing edge of the clock signal and a leading edge of the inverted clock signal according to a threshold voltage and an ON-current of a transistor representative of at least one transistor of said shift register.

23. The clock signal adjusting circuit for use in an electro-optical device according to claim 22, which includes a P-channel TFT and an N-channel TFT as said transistors of said shift register, and which further comprises:

a first threshold voltage detecting portion that detects a first threshold voltage of said P-channel TFT;

a second threshold voltage detecting portion that detects a second threshold voltage of said N-channel TFT;

a first ON-current detecting portion for detecting a first ON-current of said P-channel TFT; and a second ON-current detecting portion for detecting a second ON-current detecting portion for detecting a second ON-current of said N-channel TFT, wherein said first phase adjusting portion adjusts the relative phases of the leading edge of the clock signal and the trailing edge of the inverted clock signal according to the first threshold voltage and ON-current, while said second phase adjusting portion adjusts the relative phases of the trailing edge of the clock signal and the leading edge of the inverted clock signal according to the second threshold voltage and ON-current.

24. The clock signal adjusting circuit for use in an electro-optical device according to claim 23, wherein said first phase adjusting portion increases a delay time of the trailing edge of the inverted clock signal with respect to the leading edge of the clock signal as the first ON-current increases.

25. The clock signal adjusting circuit for use in an electro-optical device according to claim 23, wherein said second phase adjusting portion increases a delay time of the leading edge of the clock signal with respect to the trailing edge of the inverted clock signal as the second ON-current increases.

26. The clock signal adjusting circuit for use in an electro-optical device according to claim 22, wherein the clock signal adjusting circuit further comprises a delay circuit that delays pulses for generating the clock signal and a distribution circuit that distributes the delayed pulses to the first phase adjusting portion and the second phase adjusting portion, the first phase adjusting portion and the second phase adjusting portion that delay the delayed and distributed pulses step by step and generate a plurality of output signals, select the output signal according to the detected threshold voltage, and adjust relative phases of the clock signal and the inverted clock signal according to the selected output signal.

27. The clock signal adjusting circuit for use in an electro-optical device according to claim 22, wherein said shift register is constituted by cascade-connecting a plurality of unit circuits, wherein each of said unit circuits comprises a first inverter being supplied with an input signal of said unit circuit and a latch circuit that comprises a second inverter, which is operative to invert an output signal of said first inverter and to output a resultant signal as an output signal of said unit circuit, and a third inverter, which is operative to invert an output signal of said second inverter and to supply the inverted signal to an input terminal of said second inverter, wherein said first inverter is structured so that said first inverter has a first P-channel TFT, a second P-channel TFT, a first N-channel TFT, and a second N-channel TFT, which are serially series-connected between a first power supply and a second power supply, that an output signal of said first inverter is fetched from a connecting point between said second P-channel TFT and said first N-channel TFT, that a gate of said second P-channel TFT is connected to a gate of said first N-channel TFT, that an input signal to a corresponding one of said plurality of unit circuits is supplied to a connecting point between said second P-channel TFT and said first N-channel TFT, that a clock signal is supplied to a gate of said first P-channel TFT of each odd-numbered one of said plurality of unit circuits, that an inverted clock signal is supplied to a gate of said second N-channel TFT of each odd-numbered one of said plurality of unit circuits, and that an inverted clock signal is supplied to a gate of said first P-channel TFT of each even-numbered one of said plurality of unit circuits, that a clock signal is supplied to a gate of said second N-channel TFT of each even-numbered one of said plurality of unit circuits.

28. A method of producing an electro-optical device having a display panel, which has a display portion including a plurality of scanning lines, a plurality of data lines, and pixels respectively provided correspondingly to intersections between said scanning lines and said data lines, and also has a driving portion that drives said display portion by using a shift register, and also having a clock signal generating circuit enabled to generate a clock signal and an inverted clock signal, which are supplied to said shift register, and to adjust relative phases of the clock signal and the inverted clock signal, said method comprising the steps of:

manufacturing said display panel; measuring a threshold voltage of transistor representative of at least one transistor of said shift register of said manufactured display panel; and adjusting the phases of the clock signal and the inverted clock signal according to the measured threshold voltage.

29. The method of producing an electro-optical device according to claim 28, wherein the step of adjusting phases of the clock signal and the inverted clock signal comprises the steps of:

delaying pulses for generating the clock signal;

distributing the delayed pulses to a trailing edge control circuit and a leading edge control circuit;

delaying the delayed and distributed pulses step by step and generating a plurality of output signals, in each of the trailing edge control circuit and the leading edge control circuit;

selecting the output signal according to the detected threshold voltage, in each of the trailing edge control circuit and the leading edge control circuit; and adjusting the relative phases of the clock signal and the inverted clock signal according to the selected output signal.

* * * * *